US009269915B2

(12) United States Patent
Miyake

(10) Patent No.: US 9,269,915 B2
(45) Date of Patent: Feb. 23, 2016

(54) DISPLAY DEVICE

(71) Applicant: Semiconductor Energy Laboratory Co., Ltd., Atsugi-shi, Kanagawa-ken (JP)

(72) Inventor: Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/480,766

(22) Filed: Sep. 9, 2014

(65) Prior Publication Data
US 2015/0076473 A1 Mar. 19, 2015

(30) Foreign Application Priority Data

Sep. 18, 2013 (JP) .................................. 2013-192638

(51) Int. Cl.
*H01L 51/00* (2006.01)
*H01L 27/32* (2006.01)
*H01L 51/52* (2006.01)

(52) U.S. Cl.
CPC ........ *H01L 51/0097* (2013.01); *H01L 27/3216* (2013.01); *H01L 27/3218* (2013.01); *H01L 27/3244* (2013.01); *H01L 51/5284* (2013.01)

(58) Field of Classification Search
CPC .................. H01L 51/0097; H01L 27/3244
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Roy Potter
*Assistant Examiner* — Paul Patton
(74) *Attorney, Agent, or Firm* — Eric J. Robinson; Robinson Intellectual Property Law Office, P.C.

(57) ABSTRACT

A display device having high display quality is provided. In the display device that includes a plurality of display regions having different normal directions, the arrangement directions of a plurality of subpixels included in pixels vary between the display regions.

16 Claims, 25 Drawing Sheets

(56) References Cited

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,415,208 B2 | 4/2013 | Takayama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2004-103957 A | 4/2004 |
| JP | 2004-273614 A | 9/2004 |
| JP | 2004-273732 A | 9/2004 |
| JP | 2008-287068 A | 11/2008 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3-A2O3-Bo Systems [A; Fe, Ga, Or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID Internatioanl Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Disest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Cotrolled Amorphous GIZO (Ga2O3—In2O3'ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th Internatioanl Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

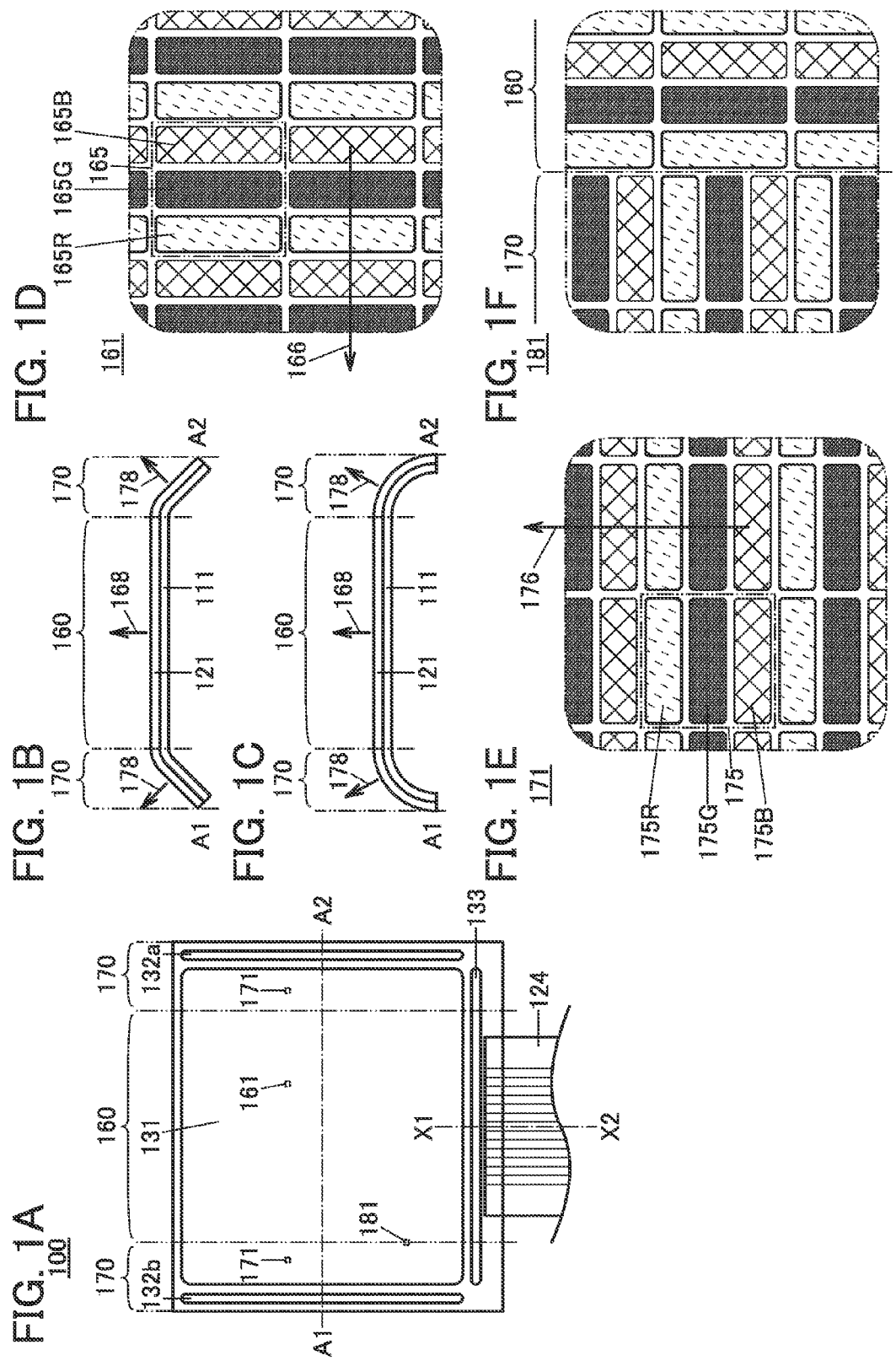

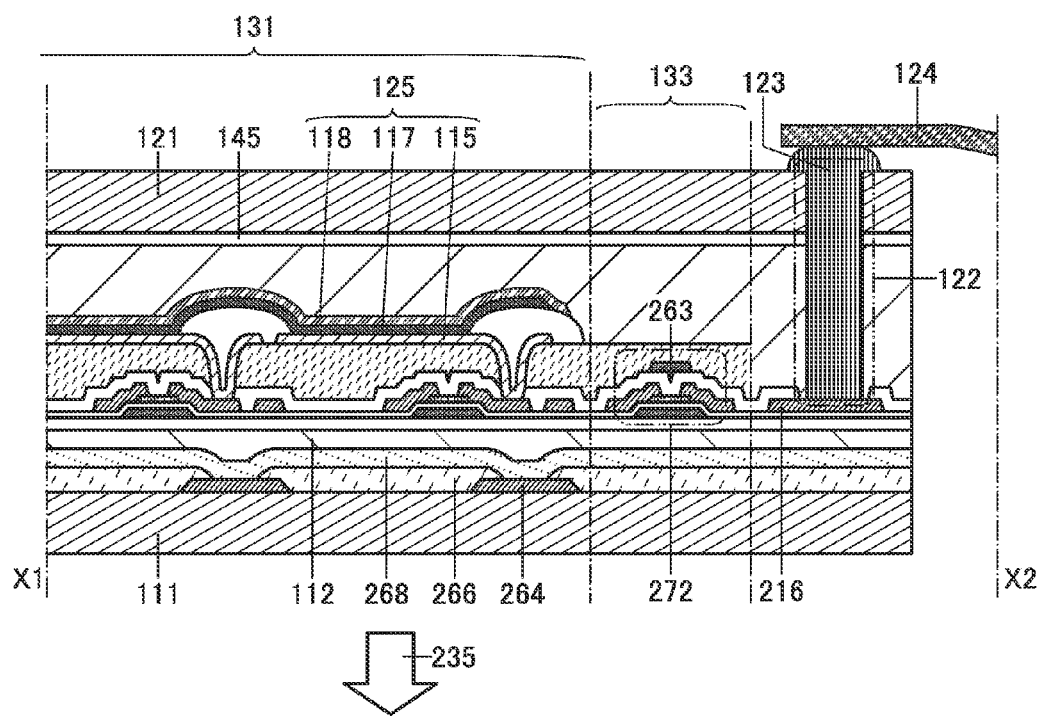

130

θ

130

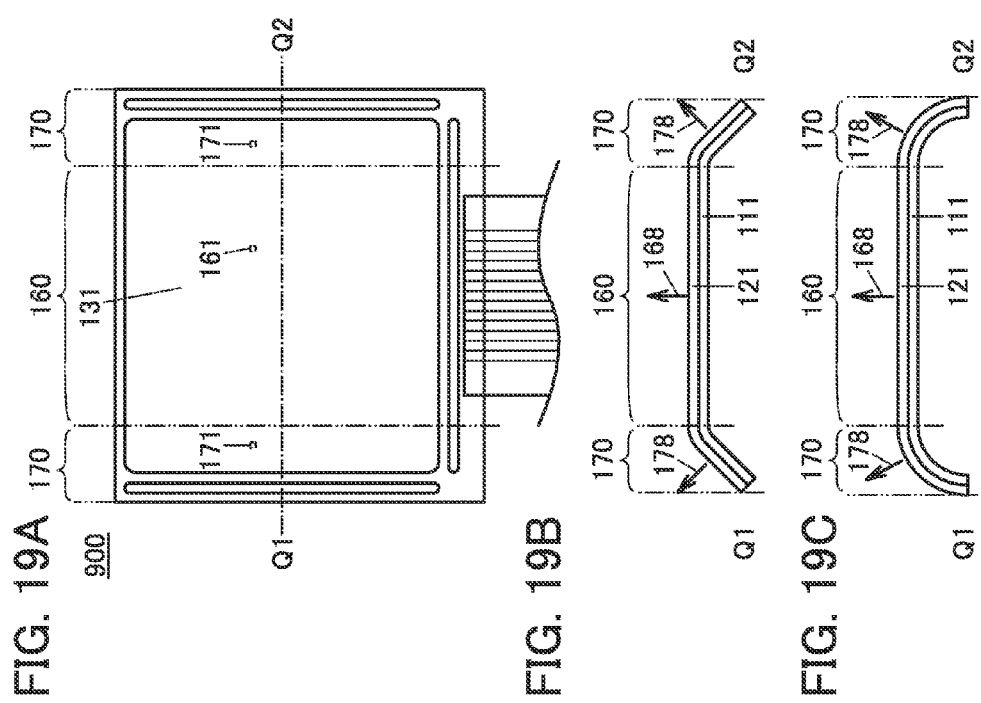

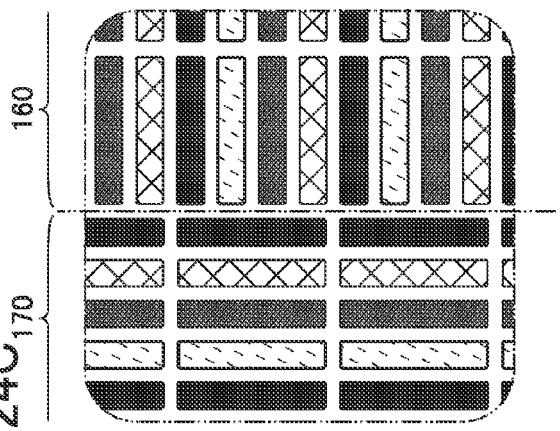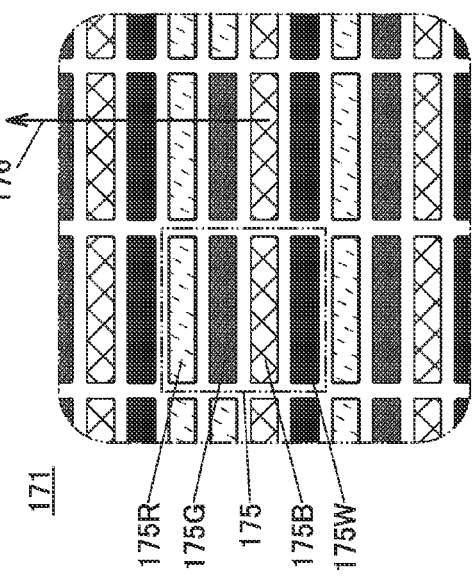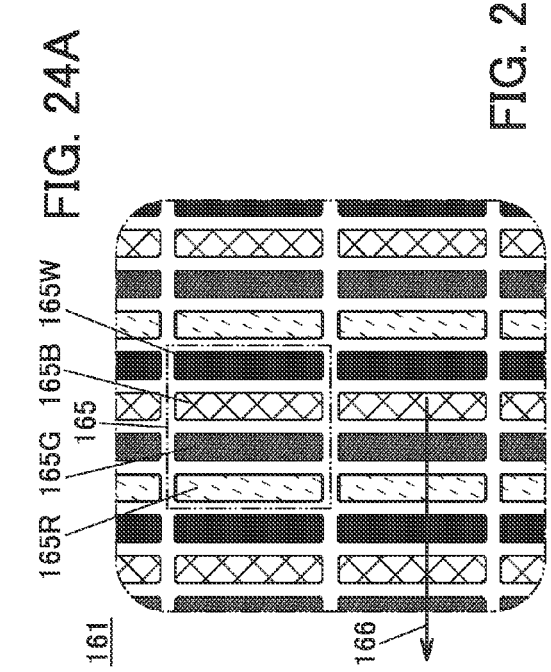
FIG. 24A
FIG. 24B
FIG. 24C

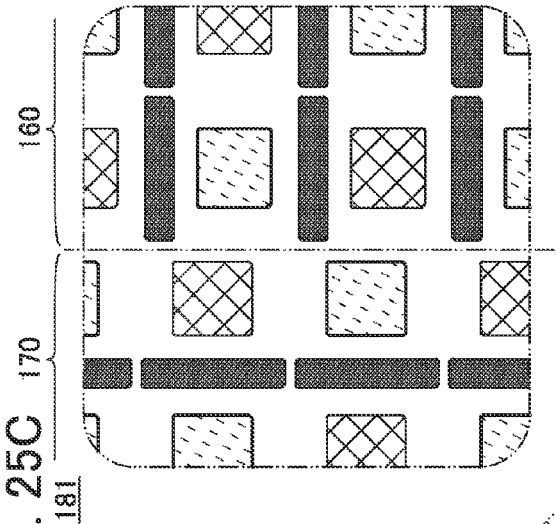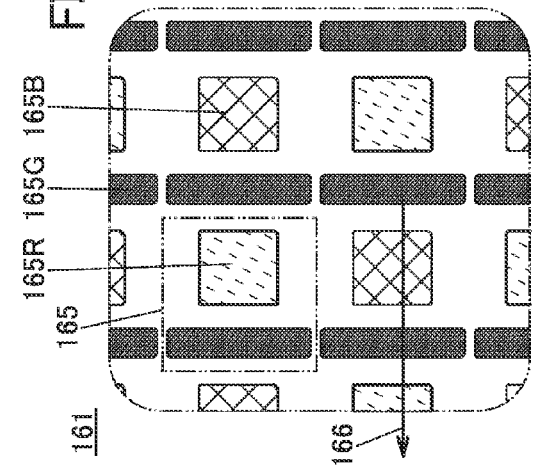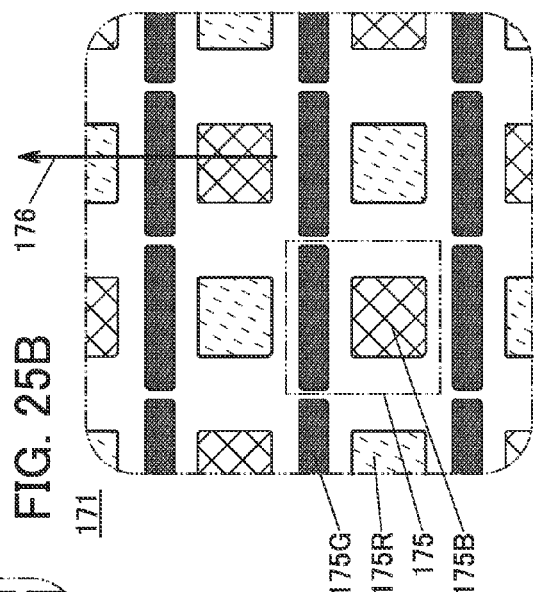
FIG. 25C
FIG. 25B
FIG. 25A

DISPLAY DEVICE

BACKGROUND OF THE INVENTION

1. Field of the Invention

One embodiment of the present invention relates to an object, a method, or a manufacturing method. In addition, one embodiment of the present invention relates to a process, a machine, manufacture, or a composition of matter. In particular, one embodiment of the present invention relates to a light-emitting device, a display device, an electronic device, a lighting device, a manufacturing method thereof, usage thereof, an operation method thereof, or the like. Specifically, one embodiment of the present invention relates to a light-emitting device, a display device, an electronic device, or a lighting device that utilizes electroluminescence (hereinafter also referred to as EL), a manufacturing method thereof, usage thereof, an operation method thereof, or the like.

Note that in this specification, a semiconductor device refers to all devices that can operate by utilizing semiconductor characteristics. A transistor and a semiconductor circuit are semiconductor devices. A storage device, an imaging device, a display device, a light-emitting device, an electro-optical device, an electronic device, and the like include a semiconductor device in some cases.

2. Description of the Related Art

Recent light-emitting devices and display devices are expected to be applied to a variety of uses and become diversified.

For example, light-emitting devices and display devices for mobile devices and the like need to be thin, lightweight, capable of being provided on a curved surface, and unlikely to be broken.

Light-emitting elements utilizing EL (also referred to as EL elements) have features such as ease of thinning and lightening, high-speed response to input signals, and driving with a DC low voltage source; thus, application of the light-emitting elements to light-emitting devices and display devices has been proposed.

For example, Patent Document 1 discloses a flexible active-matrix display device in which an organic EL element or a transistor serving as a switching element is provided over a film substrate.

REFERENCE

Patent Document 1: Japanese Published Patent Application No. 2003-174153

A display device 900 in FIG. 19A includes a region 160 where a display region 131 faces a viewer and regions 170 where the display region 131 does not face the viewer. FIGS. 19B and 19C are cross-sectional views of a portion Q1-Q2 indicated by alternate long and short dash lines in FIG. 19A. FIG. 19B illustrates a state where the regions 170 are bent, and FIG. 19C illustrates a state where the regions 170 are curved. In FIGS. 19B and 19C, a normal direction of a portion near the center of the region 160 in the portion Q1-Q2 is referred to as a normal vector 168, and a normal direction of a portion near the center of the region 170 in the portion Q1-Q2 is referred to as a normal vector 178. In each of FIGS. 19B and 19C, the normal direction of the portion near the center of the region 160 is different from the normal direction of the portion near the center of the region 170.

The display device 900 further includes substrates 111 and 121, and a light-emitting element and a coloring layer (not illustrated) between the substrates 111 and 121. FIG. 19D is an enlarged view of a portion 161 that is part of the display region 131 in the region 160. FIG. 19E is an enlarged view of a portion 171 that is part of the display region 131 in the region 170.

The display region 131 includes a plurality of pixels arranged in matrix. One pixel includes at least three subpixels. The three subpixels are arranged in stripes and each emit red light, green light, or blue light. In FIG. 19D, the pixel in the region 160 is referred to as a pixel 165, and a subpixel that emits red light, a subpixel that emits green light, and a subpixel that emits blue light are referred to as a subpixel 165R, a subpixel 165G, and a subpixel 165B, respectively. In FIG. 19E, the pixel in the region 170 is referred to as a pixel 175, and a subpixel that emits red light, a subpixel that emits green light, and a subpixel that emits blue light are referred to as a subpixel 175R, a subpixel 175G, and a subpixel 175B, respectively.

Next, a state where a viewer 910 watches an image displayed on the region 160 is described. FIG. 20A illustrates the relationship between the viewer 910 and light 235 emitted from the pixel 165. In addition, FIG. 20A is a cross-sectional schematic view of the pixel 165.

The subpixel 165R includes a light-emitting element 125 and a coloring layer 266R. The subpixel 165G includes the light-emitting element 125 and a coloring layer 266G. The subpixel 165B includes the light-emitting element 125 and a coloring layer 266B. The light 235 emitted from the light-emitting element 125 is colored when passing the coloring layer.

For example, in the subpixel 165G, the white light 235 emitted from the light-emitting element 125 included in the subpixel 165G is converted into the green light 235 by the coloring layer 266G and reaches the viewer 910. Note that part of the white light 235 emitted from the light-emitting element 125 enters the coloring layer of another subpixel and is converted with an unintended color in some cases. However, since the viewer 910 faces the display region 131 in the region 160, the light 235 converted with an unintended color is hardly recognized by the viewer 910.

Next, a state where the viewer 910 watches an image displayed on the region 170 is described. FIG. 20B illustrates the relationship between the viewer 910 and the light 235 emitted from the pixel 175. In addition, FIG. 20B is a cross-sectional schematic view of the pixel 175.

The subpixel 175R includes the light-emitting element 125 and the coloring layer 266R. The subpixel 175G includes the light-emitting element 125 and the coloring layer 266G. The subpixel 175B includes the light-emitting element 125 and the coloring layer 266B. The light 235 emitted from the light-emitting element 125 is colored when passing the coloring layer.

In the region 170, the viewer 910 does not face the display region 131. Thus, the viewer 910 recognizes part of the light 235 that is emitted from the light-emitting element 125, is incident on the coloring layer of another subpixel, and is converted with an unintended color.

A display device that includes a region where a display region faces a viewer and a region where a display region does not face the viewer in this manner tends to have large variations in the display quality of the display region and low display quality.

SUMMARY OF THE INVENTION

It is an object of one embodiment of the present invention to provide a display device or electronic device having high visibility.

It is an object of one embodiment of the present invention to provide a display device or electronic device having high display quality.

It is an object of one embodiment of the present invention to provide a highly reliable display device or electronic device.

It is an object of one embodiment of the present invention to provide a display device or electronic device that is less likely to be broken.

It is an object of one embodiment of the present invention to provide a low-power display device or electronic device.

It is an object of one embodiment of the present invention to provide a novel display device or electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device that includes a display region including a first region and a second region. The display region includes a plurality of pixels. The pixel includes a plurality of subpixels. The arrangement direction of the subpixels in the first region is different from the arrangement direction of the subpixels in the second region.

One embodiment of the present invention is a display device that includes a display region including a first region and a second region. A normal direction of a portion near the center of the first region is different from a normal direction of a portion near the center of the second region. The display region includes a plurality of pixels. The pixel includes a plurality of subpixels. The arrangement direction of the subpixels in the first region is different from the arrangement direction of the subpixels in the second region.

According to one embodiment of the present invention, it is possible to provide a display device or electronic device having high visibility.

According to one embodiment of the present invention, it is possible to provide a display device or electronic device having high display quality.

According to one embodiment of the present invention, it is possible to provide a highly reliable display device or electronic device.

According to one embodiment of the present invention, it is possible to provide a display device or electronic device that is less likely to be broken.

According to one embodiment of the present invention, it is possible to provide a low-power display device or electronic device.

According to one embodiment of the present invention, it is possible to provide a novel display device or electronic device. Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

In the accompanying drawings:

FIGS. 1A to 1F illustrate one aspect of a display device;

FIG. 16 illustrates one aspect of a display device;

FIGS. 19A to 19E are diagrams illustrating problems;

FIGS. 24A to 24C illustrate one aspect of a display device; and

FIGS. 25A to 25C illustrate one aspect of a display device.

DETAILED DESCRIPTION OF THE INVENTION

Figure 2A:
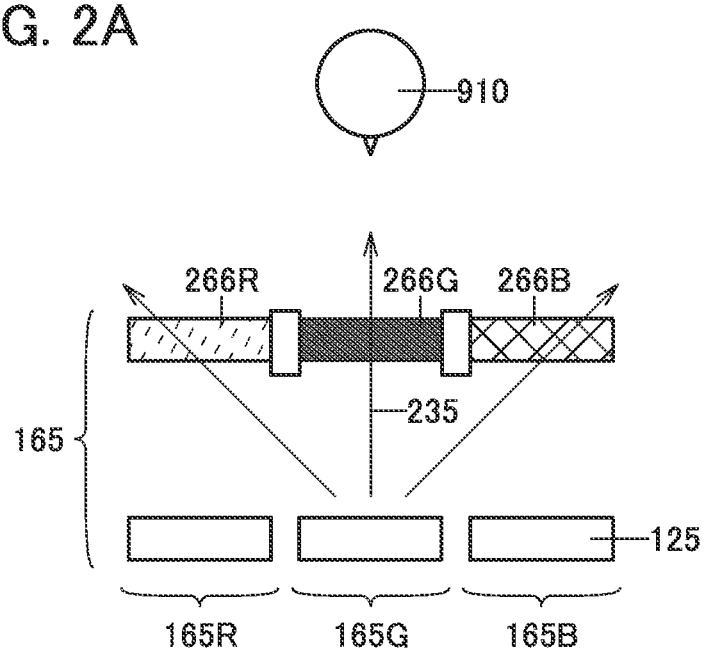
FIGS. 2A and 2B illustrate one aspect of a display device.

Embodiments of the present invention will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In the structures of the invention described below, the same portions or portions having similar functions are denoted by the same reference numerals in different drawings, and the description of such portions is not repeated.

Note that in each drawing described in this specification, the size, the layer thickness, or the region of each component might be exaggerated or omitted for clarity of the invention. Thus, embodiments of the present invention are not limited to such a scale. Especially in a top view or a perspective view, some components might not be illustrated for easy understanding.

The position, the size, the range, or the like of each component illustrated in the drawings and the like are not accurately represented in some cases for easy understanding of the invention. Thus, the disclosed invention is not necessarily limited to the position, the size, the range, or the like disclosed in the drawings and the like. For example, in an actual manufacturing process, a resist mask or the like might be unintentionally reduced in size by treatment such as etching; however, the reduction is not illustrated in some cases for easy understanding.

Ordinal numbers such as "first" and "second" in this specification and the like are used to avoid confusion among components and do not indicate the priority or the order such as the order of steps or the stacking order. A term without an ordinal number in this specification and the like might be provided with an ordinal number in a claim to avoid confusion among components.

In addition, in this specification and the like, the term "electrode" or "wiring" does not limit the function of a component. For example, an electrode is used as part of a wiring in some cases, and vice versa. Furthermore, the term "electrode" or "wiring" can include the case where a plurality of electrodes or wirings are formed in an integrated manner.

Note that the term "over" or "below" in this specification and the like does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having opposite polarity is employed or the direction of current flow is changed in circuit operation. Thus, it is difficult to define which is a source or a drain. Accordingly, the terms "source" and "drain" can be switched in this specification.

In this specification and the like, the expression "electrically connected" includes the case where components are connected to each other through an object having any electric action. There is no particular limitation on the object having any electric action as long as electric signals can be transmitted and received between components that are connected to each other through the object. Accordingly, even when the expression "electrically connected" is used, there is a case in which no physical connection is made and a wiring is just extended in an actual circuit.

In this specification, the term "parallel" indicates that an angle formed between two straight lines is greater than or equal to −10 to 10°, and accordingly also includes the case where the angle is −5 to 5°. In addition, the term "perpendicular" or "vertical" indicates that an angle formed between two straight lines is 80 to 100°, and accordingly includes the case where the angle is 85 to 95°.

In this specification, in the case where an etching process is performed after a photolithography process, a resist mask formed in the photolithography process is removed after the etching process, unless otherwise specified.

Embodiment 1

A display device 100 in FIG. 1A includes the region 160 where the display region 131 faces a viewer and the region 170 where the display region 131 does not face the viewer. The display device 100 further includes driver circuits 132a, 132b, and 133. FIGS. 1B and 1C are cross-sectional views of a portion A1-A2 indicated by alternate long and short dash lines in FIG. 1A. FIG. 1B illustrates a state where the region 170 is bent, and FIG. 1C illustrates a state where the region 170 is curved. In FIGS. 1B and 1C, a normal direction of a portion near the center of the region 160 in the portion A1-A2 is referred to as the normal vector 168, and a normal direction of a portion near the center of the region 170 in the portion A1-A2 is referred to as the normal vector 178. In each of FIGS. 1B and 1C, the normal direction of the portion near the center of the region 160 is different from the normal direction of the portion near the center of the region 170.

The display device 100 further includes the substrates 111 and 121, and a light-emitting element and a coloring layer (not illustrated) between the substrates 111 and 121. FIG. 1D is an enlarged view of the portion 161 that is part of the display region 131 in the region 160. FIG. 1E is an enlarged view of the portion 171 that is part of the display region 131 in the region 170. FIG. 1F is an enlarged view of a portion 181 that includes a boundary of the regions 160 and 170.

The display region 131 includes a plurality of pixels arranged in matrix. One pixel includes at least three subpixels. The subpixels are arranged in stripes and each emit red light, green light, or blue light.

In FIGS. 1A to 1F, the planar shapes of the subpixels are rectangles. In this specification and the like, the arrangement of subpixels whose long sides are adjacent to each other in a lateral direction is referred to as H arrangement, and the arrangement of subpixels whose long sides are adjacent to each other in a longitudinal direction is referred to as V arrangement. In other words, the direction of H arrangement is different from the direction of V arrangement. Note that in this embodiment, a direction 166 of H arrangement is perpendicular to a direction 176 of V arrangement; however, this embodiment is not limited thereto.

In FIG. 1D, the pixel in the region 160 is referred to as the pixel 165, and a subpixel that emits red light, a subpixel that emits green light, and a subpixel that emits blue light are referred to as the subpixel 165R, the subpixel 165G, and the subpixel 165B, respectively. In the pixel 165, the arrangement of the three subpixels is H arrangement.

In FIG. 1E, the pixel in the region 170 is referred to as the pixel 175, and a subpixel that emits red light, a subpixel that emits green light, and a subpixel that emits blue light are referred to as the subpixel 175R, the subpixel 175G, and the subpixel 175B, respectively. In the pixel 175, the arrangement of the three subpixels is V arrangement.

The color of light emitted from the subpixel may be yellow, cyan, magenta, or the like instead of red, green, or blue. Alternatively, these lights may be combined. For example, one pixel may include four subpixels that emit red light, green light, blue light, and yellow light. By increasing the number of subpixels, the reproducibility of halftones can be particularly improved. Thus, the display quality of the display device can be improved. Alternatively, as illustrated in FIGS. 24A to 24C, one pixel may include four subpixels that emit red light, green light, blue light, and white light. The subpixel that emits white light can increase the luminance of the display region. Alternatively, depending on the use of the display device, one pixel may include two subpixels.

In FIG. 24A, the pixel in the region 160 is referred to as the pixel 165, and a subpixel that emits red light, a subpixel that emits green light, a subpixel that emits blue light, and a subpixel that emits white light are referred to as the subpixel 165R, the subpixel 165G, the subpixel 165B, and a subpixel 165W, respectively. In the pixel 165, the arrangement of the four subpixels is H arrangement.

In FIG. 24B, the pixel in the region 170 is referred to as the pixel 175, and a subpixel that emits red light, a subpixel that emits green light, a subpixel that emits blue light, and a subpixel that emits white light are referred to as the subpixel 175R, the subpixel 175G, the subpixel 175B, and a subpixel 175W, respectively. In the pixel 175, the arrangement of the four subpixels is V arrangement.

Note that the occupation areas or shapes of the subpixels may be the same or different. In addition, arrangement is not limited to stripe arrangement. For example, delta arrangement, Bayer arrangement, pentile arrangement, or the like can be used. FIGS. 25A to 25C illustrate examples of pentile arrangement.

Next, effects of V arrangement used as the arrangement of the subpixels included in the pixel 175 are described with reference to FIGS. 2A and 2B.

FIG. 2A illustrates the relationship between the viewer 910 and the light 235 emitted from the pixel 165 in the region 160. In addition, FIG. 2A is a cross-sectional schematic view of the pixel 165 seen from a direction perpendicular to the arrangement direction 166.

In the region 160, the viewer 910 faces the display region 131; thus, the pixel 165 also faces the viewer 910. Accordingly, light emitted from the light-emitting element included in the subpixel is convened by the coloring layer included in the subpixel and reaches the viewer 910. For example, in the subpixel 165G, the white light 235 emitted from the light-emitting element 125 included in the subpixel 165G is converted into the green light 235 by the coloring layer 266G and reaches the viewer 910. Note that part of the white light 235 emitted from the light-emitting element 125 is scattered, is incident on the coloring layer of another subpixel, and is converted with an unintended color in some cases. However, since the viewer 910 faces the display region 131 in the region 160, the light 235 converted with an unintended color by scattering is hardly recognized by the viewer 910.

Figure 2B:
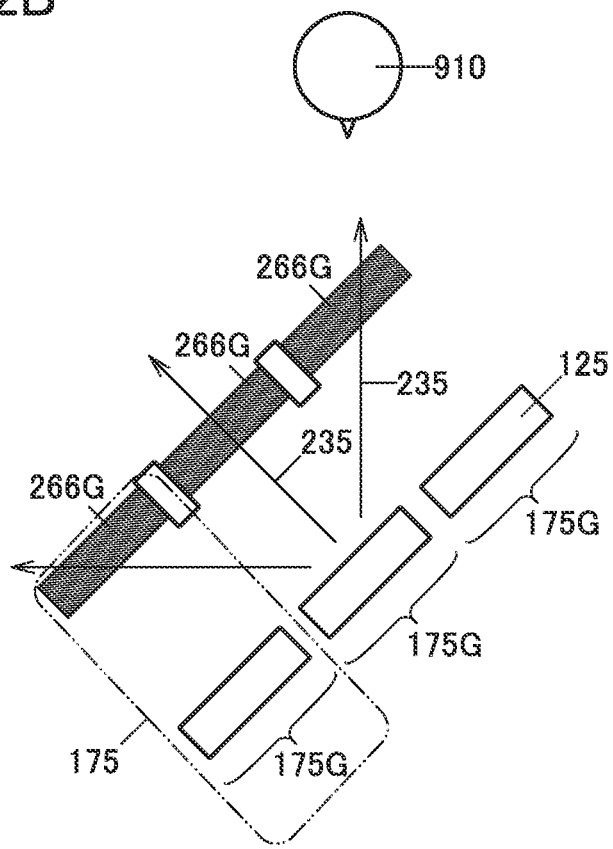

FIG. 2B illustrates the relationship between the viewer 910 and the light 235 emitted from the pixel 175 in the region 170. In addition, FIG. 2B is a cross-sectional schematic view of the pixel 175 seen from the arrangement direction 176.

In the region 170, the viewer 910 does not face the display region 131. Thus, the viewer 910 recognizes part of the light 235 that is emitted from the light-emitting element 125, is incident on the coloring layer of another subpixel, and is converted. However, in the display device 100 in this embodiment, the arrangement of the subpixels included in the pixel 175 is V arrangement; thus, the light 235 that is incident on the coloring layer of another subpixel, is converted, and reaches the viewer 910 is converted with a color substantially the same as an intended color.

When the arrangement of the subpixels included in the pixel 175 is V arrangement, variations in the display quality of the display device 100 can be reduced. Thus, a display device having high visibility can be achieved. In addition, a display device having high display quality can be achieved.

In this embodiment, a right or left side of the display region 131 included in the display device 100 is bent or curved; however, one embodiment of the present invention is not limited thereto. For example, even when an upper or lower side or a corner of the display region 131 is bent or curved, a display device having high display quality can be achieved by setting the arrangement of the subpixels appropriately.

Although the example in which the light-emitting element 125 emits the white light 235 is described, one embodiment of the present invention is not limited thereto. The light-emitting element 125 may emit light of any one color of red (R), blue (B), and green (G). In such a case, the light-emitting elements 125 in the subpixels preferably emit lights of different colors.

This embodiment can be combined with any of the structures described in the other embodiments as appropriate.

Embodiment 2

Figure 3:
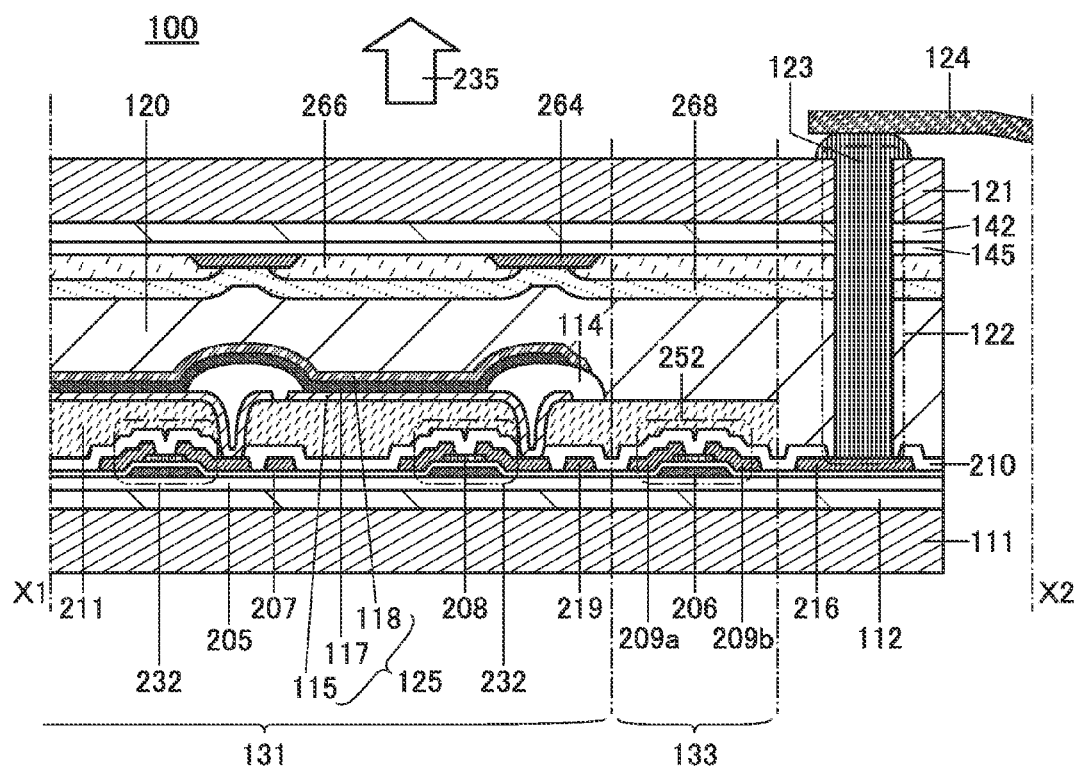
FIG. 3 illustrates one aspect of a display device.

In this embodiment, a structure example of the display device 100 is described with reference to FIG. 3. FIG. 3 is a cross-sectional schematic diagram of a portion X1-X2 indicated by alternate long and short dash lines in FIG. 1A.

<Structure of Display Device>

The display device 100 described in this specification includes a terminal electrode 216 and the light-emitting element 125 including a first electrode 115, an EL layer 117, and a second electrode 118. The plurality of light-emitting elements 125 are formed in the display region 131. A transistor 232 for controlling the amount of light emitted from the light-emitting element 125 is connected to each light-emitting element 125.

The terminal electrode 216 is electrically connected to an external electrode 124 through an anisotropic conductive connection layer 123 formed in an opening 122. In addition, the terminal electrode 216 is electrically connected to the driver circuits 132a, 132b, and 133.

The driver circuits 132a, 132b, and 133 each include a plurality of transistors 252. The driver circuits 132a, 132b, and 133 each have a function of determining which of the light-emitting elements 125 in the display region 131 is supplied with a signal from the external electrode 124.

In the display device 100 described in this specification, the substrates 111 and 121 are attached to each other with a bonding layer 120 positioned therebetween. An insulating layer 205 is formed over the substrate 111 with a bonding layer 112 positioned therebetween. The insulating layer 205 is preferably formed using a single layer or a multilayer of silicon oxide, silicon nitride, silicon oxynitride, silicon nitride oxide, aluminum oxide, aluminum oxynitride, aluminum nitride oxide, or the like. The insulating layer 205 can be formed by sputtering, CVD, thermal oxidation, a coating method, a printing method, or the like.

An insulating layer 145 is formed over the substrate 121 with a bonding layer 142 positioned therebetween. A light-blocking layer 264 is formed over the substrate 121 with the insulating layer 145 positioned therebetween. In addition, a coloring layer 266 and an overcoat layer 268 are formed over the substrate 121 with the insulating layer 145 positioned therebetween.

Note that the insulating layer 205 functions as a base layer and can prevent or reduce diffusion of moisture or impurity elements from the substrate 111, the bonding layer 112, or the like to the transistor or the light-emitting element. The insulating layer 145 functions as a base layer and can prevent or reduce diffusion of moisture or impurity elements from the substrate 121, the bonding layer 142, or the like to the transistor or the light-emitting element. The insulating layer 145 can be formed using a material and a method similar to those of the insulating layer 205.

An organic resin material, a glass material that is thin enough to have flexibility, or the like can be used for each of the substrates 111 and 121. In the case where the display device 100 is a so-called bottom-emission display device or a dual-emission display device, a material that transmits light emitted from the EL layer 117 is used for the substrate 111. In the case where the display device 100 is a top-emission display device or a dual-emission display device, a material that transmits light emitted from the EL layer 117 is used for the substrate 121.

Examples of materials that have flexibility and transmit visible light, which can be used for the substrates 111 and 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and the like. In the case where light does not have to be transmitted, a non-light-transmitting substrate may be used. The substrate 121 or 111 may be, for example, a stainless steel substrate or a stainless steel foil substrate.

The thermal expansion coefficient of each of the substrates 111 and 121 is preferably less than or equal to 30 ppm/K, more preferably less than or equal to 10 ppm/K. In addition, on a surface of each of the substrates 111 and 121, a protective film having low water permeability may be formed in advance; examples of the protective film include a film containing nitrogen and silicon, such as a silicon nitride film or a silicon oxynitride film, and a film containing nitrogen and aluminum, such as an aluminum nitride film. Note that a structure in which a fibrous body is impregnated with an organic resin (also referred to as prepreg) may be used as each of the substrates 111 and 121.

With such substrates, a non-breakable display device can be provided. Alternatively, a lightweight display device can be provided. Alternatively, an easily bendable display device can be provided.

In addition, the transistors 232 and 252, the terminal electrode 216, and a wiring 219 are formed over the insulating layer 205. Note that although a channel-etched transistor that is a type of bottom-gate transistor is illustrated as each of the transistors 232 and 252 in this embodiment, a channel-protective transistor, a top-gate transistor, or the like can be used. It is also possible to use a dual-gate transistor in which a semiconductor layer where a channel is formed is provided between two gate electrodes.

The transistors 232 and 252 may have similar structures. However, the size (e.g., channel length and channel width) or the like of each transistor can be adjusted as appropriate.

The transistors 232 and 252 each include a gate electrode 206, a gate insulating layer 207, a semiconductor layer 208, a source electrode 209a, and a drain electrode 209b.

The terminal electrode 216, the wiring 219, the gate electrode 206, the source electrode 209a, and the drain electrode 209b can be formed using a material and a method similar to those of the terminal electrode 216. In addition, the gate insulating layer 207 can be formed using a material and a method similar to those of the insulating layer 205.

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor; or the like can be used.

Note that an oxide semiconductor has an energy gap as wide as 2.8 eV or more and high visible-light transmittance. In a transistor obtained by processing an oxide semiconductor under appropriate conditions, off-state current can be lower than or equal to 100 zA ($1\times10^{-19}$ A), lower than or equal to 10 zA ($1\times10^{-20}$ A), or lower than or equal to 1 zA ($1\times10^{-21}$ A) at operating temperature (e.g., 25° C.). Thus, a low-power display device can be provided.

In the case where an oxide semiconductor is used for the semiconductor layer 208, an insulating layer containing oxygen is preferably used as an insulating layer that is in contact with the semiconductor layer 208.

In addition, an insulating layer 210 is formed over the transistors 232 and 252, and an insulating layer 211 is formed over the insulating layer 210. The insulating layer 210 functions as a protective insulating layer and can prevent or reduce diffusion of impurity elements from a layer above the insulating layer 210 to the transistors 232 and 252. The insulating layer 210 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can omit polishing treatment. As the insulating material with a planarization function, for example, an organic material such as a polyimide resin or an acrylic resin can be used. Other than such organic materials, it is possible to use a low-dielectric constant material (low-k material) or the like. Note that the insulating layer 211 may be formed by stacking a plurality of insulating layers formed using any of these materials.

In addition, over the insulating layer 211, the light-emitting element 125 and a partition 114 for separating the light-emitting elements 125 are formed.

The display device 100 is a so-called top-emission display device in which the light 235 emitted from the light-emitting element 125 is extracted from the substrate 121 side through the coloring layer 266.

The light-emitting element 125 is electrically connected to the transistors 232 through openings formed in the insulating layers 211 and 210.

The substrate 121 is formed to face the substrate 111 and may thus be referred to as a counter substrate.

Figure 21A:
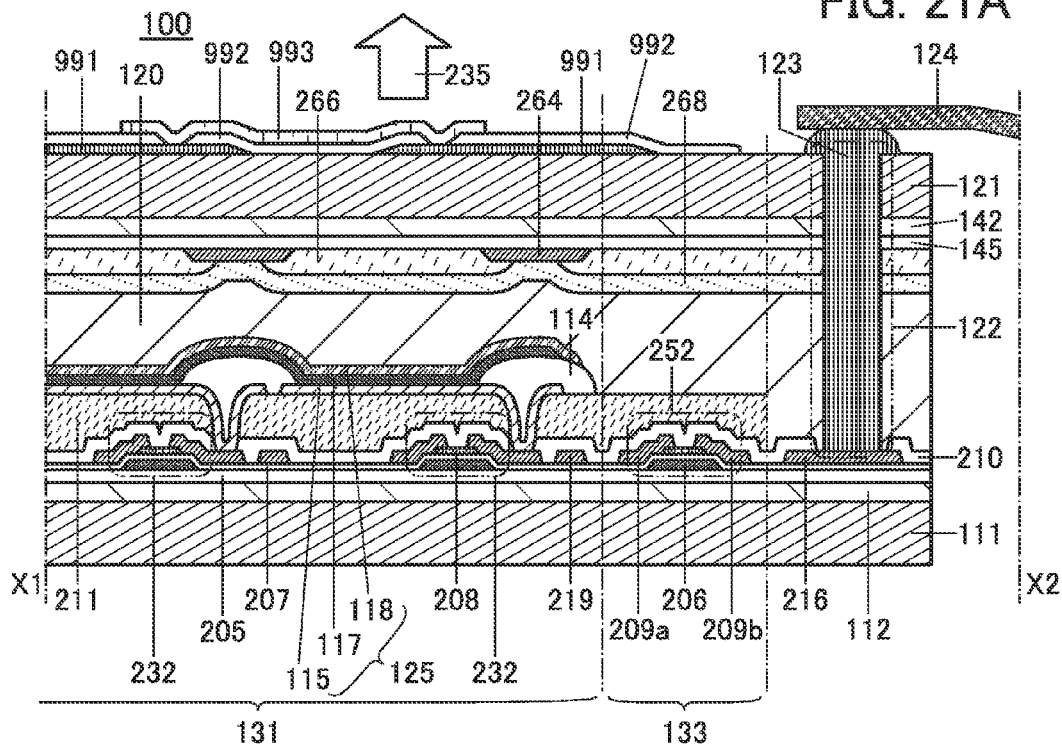
FIGS. 21A and 21B each illustrate one aspect of a display device.

Note that as illustrated in FIG. 21A, a touch sensor may be provided over the substrate 121. Providing the touch sensor as described above can reduce displacement of the touch sensor when the display device is bent. The touch sensor is formed using a conductive layer 991, a conductive layer 993, and the like. In addition, an insulating layer 992 is formed between the conductive layers 991 and 993.

As the conductive layer 991 and/or the conductive layer 993, a transparent conductive film of indium tin oxide, indium zinc oxide, or the like is preferably used. Note that a layer containing a low-resistance material may be used for part or the whole of the conductive layer 991 and/or the conductive layer 992 to reduce resistance. For example, a single-layer structure or a layered structure of any of metals such as aluminum, titanium, chromium, nickel, copper, yttrium, zirconium, molybdenum, silver, tantalum, and tungsten and an alloy containing any of these metals as a main component can be used. Alternatively, a metal nanowire may be used as the conductive layer 991 and/or the conductive layer 992. Silver or the like is preferably used as a metal for the metal nanowire, in which case the resistance can be reduced and the sensitivity of the sensor can be improved.

The insulating layer 992 is preferably formed using a single layer or a multilayer of silicon oxide, silicon nitride, silicon oxynitride, silicon nitride oxide, aluminum oxide, aluminum oxynitride, aluminum nitride oxide, or the like. The insulating layer 992 can be formed by sputtering, CVD, thermal oxidation, a coating method, a printing method, or the like.

Figure 21B:
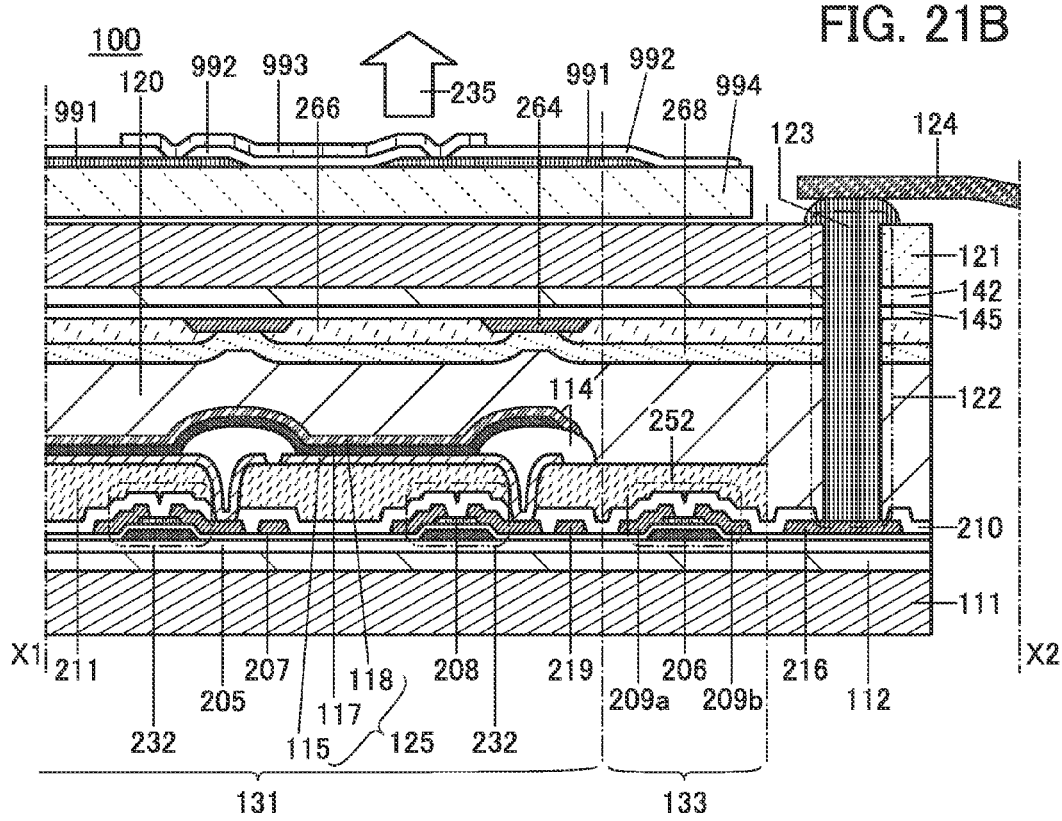

Note that the touch sensor may be formed using a substrate other than the substrate 121. FIG. 21B illustrates an example in which a touch sensor is formed using a substrate 994. Although the touch sensor is provided over the substrate 994, one aspect of the embodiment of the present invention is not limited thereto. The touch sensor may be provided below the substrate 994 (i.e., between the substrates 121 and 994). In that case, the substrate 994 may be formed using tempered glass so that the display device can be protected from damage or the like.

This embodiment can be combined with any of the structures described in the other embodiments as appropriate.

Embodiment 3

Figure 4A:
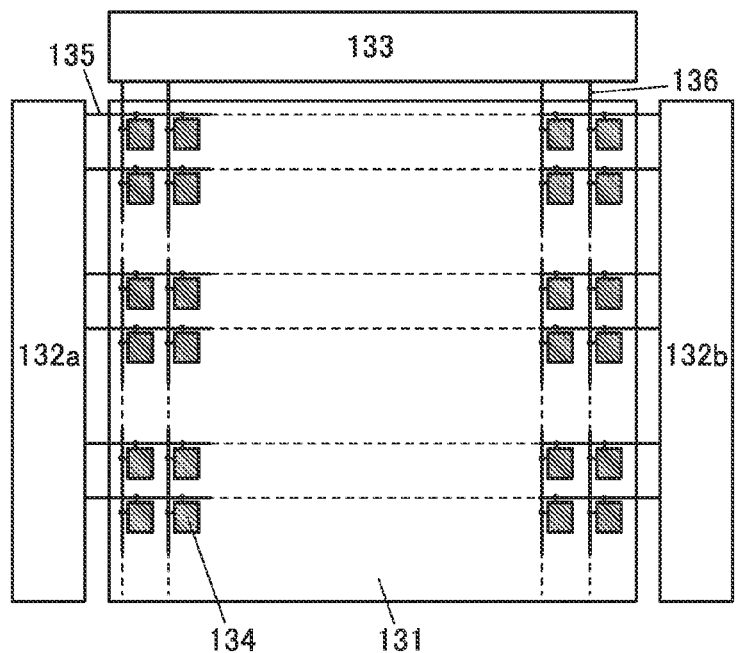
FIGS. 4A to 4C are a block diagram and circuit diagrams illustrating one aspect of a display device.

In this embodiment, a specific structure example of the display device 100 is described with reference to FIGS. 4A to 4C. FIG. 4A is a block diagram illustrating the structure of the display device 100. The display device 100 includes the display region 131 and the driver circuits 132*a*, 132*b*, and 133. The driver circuits 132*a* and 132*b* function as, for example, scan line driver circuits. The driver circuit 133 functions as, for example, a signal line driver circuit. Note that one of the driver circuits 132*a* and 132*b* may be omitted.

The display device 100 includes m wirings 135 that are arranged substantially parallel to each other and whose potentials are controlled by the driver circuit 132*a* and/or the driver circuit 132*b*, and n wirings 136 that are arranged substantially parallel to each other and whose potentials are controlled by the driver circuit 133. The display region 131 includes a plurality of pixel circuits 134 arranged in matrix. One pixel circuit 134 is used for driving one subpixel. The driver circuits 132*a*, 132*b*, and 133 may be collectively referred to as a driver circuit portion.

Each of the wirings 135 is electrically connected to the n pixel circuits 134 in a given row among the pixel circuits 134 arranged in m rows and n columns in the display region 131. Each of the wirings 136 is electrically connected to the m pixel circuits 134 in a given column among the pixel circuits 134 arranged in m rows and n columns. Note that m and n are each an integer of 1 or more.

Figure 4B:
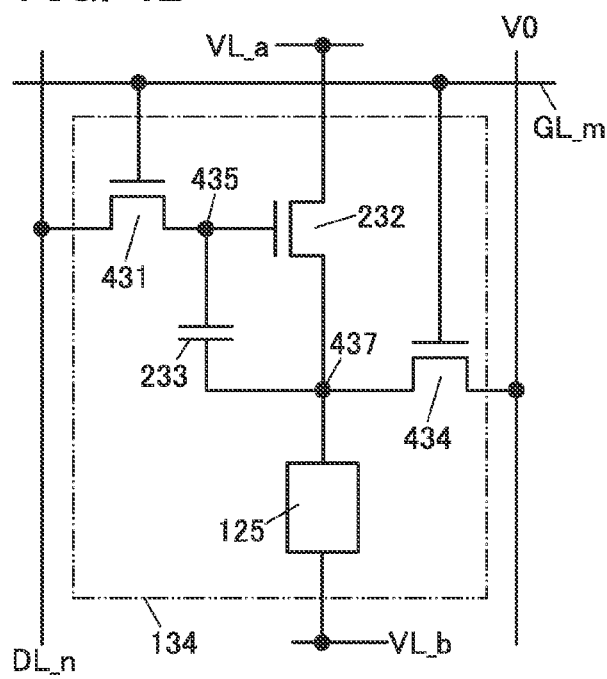
Figure 4C:
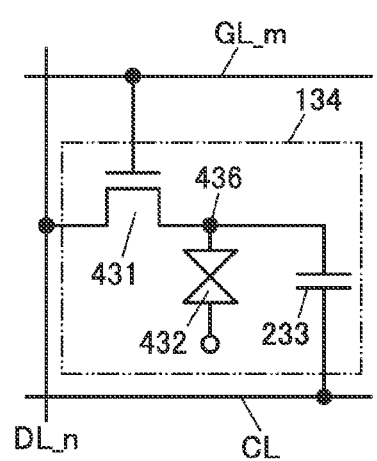

FIGS. 4B and 4C illustrate circuit structures that can be used for the pixel circuits 134 in the display device in FIG. 4A.

[Example of Pixel Circuit for Light-Emitting Display Device]

The pixel circuit 134 in FIG. 4B includes a transistor 431, a capacitor 233, the transistor 232, a transistor 434, and the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435 by being turned on or off.

One of a pair of electrodes of the capacitor 233 is electrically connected to the node 435, and the other of the pair of electrodes of the capacitor 233 is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other of the anode and the cathode of the light-emitting element 125 is electrically connected to the node 437.

As the light-emitting element 125, an organic electroluminescent element (also referred to as an organic EL element) or the like can be used, for example. Note that the light-emitting element 125 is not limited thereto and may be an inorganic EL element containing an inorganic material.

A high power supply potential VDD is supplied to one of the potential supply line VL_a and the potential supply line VL_b, and a low power supply potential VSS is supplied to the other of the potential supply line VL_a and the potential supply line VL_b.

In the display device including the pixel circuit 134 in FIG. 4B, the pixel circuits 134 are sequentially selected row by row by the driver circuit 132*a* or 132*b*, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of flowing current. This operation is sequentially performed row by row; thus, an image can be displayed.

[Example of Pixel Circuit for Liquid Crystal Display Device]

The pixel circuit 134 in FIG. 4C includes a liquid crystal element 432, the transistor 431, and the capacitor 233.

The potential of one of a pair of electrodes of the liquid crystal element 432 is set in accordance with the specifications of the pixel circuit 134 appropriately. The alignment state of the liquid crystal element 432 depends on data written to a node 436. A common potential may be applied to one of the pair of electrodes of the liquid crystal element 432 included in each of the plurality of pixel circuits 134. Furthermore, the potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method for driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including liquid crystal exhibiting a blue phase and a chiral material. The liquid crystal exhibiting a blue phase has a short response time of 1 ms or less and has optical isotropy; thus, an alignment process is not necessary. In addition, the liquid crystal exhibiting a blue phase has small viewing angle dependence because the liquid crystal has optical isotropy.

Note that a display element other than the light-emitting element 125 and the liquid crystal element 432 can be used. For example, an electrophoretic element, electronic ink, an electrowetting element, a micro electro mechanical system (MEMS), a digital micromirror device (DMD), a digital micro shutter (DMS), or an interferometric modulator (IMOD) element can be used as the display element.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. The gate electrode of the transistor 431 is electrically connected to the scan line GL_m. The transistor 431 has a function of controlling whether to write a data signal to the node 436 by being turned on or off.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 appropriately. The capacitor 233 functions as a storage capacitor for storing data written to the node 436.

For example, in the display device including the pixel circuit 134 in FIG. 4C, the pixel circuits 134 are sequentially selected row by row by the driver circuit 132a, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed.

This embodiment can be combined with any of the structures described in the other embodiments as appropriate.

Embodiment 4

In this embodiment, specific structure examples of the pixel circuit 134 that can be used for the pixels 165 and 175 included in the display device 100 are described with reference to FIGS. 5A to 5C, FIG. 6, FIG. 7, and FIG. 8.
[Structure Example of Pixel 165]

Figure 5A:
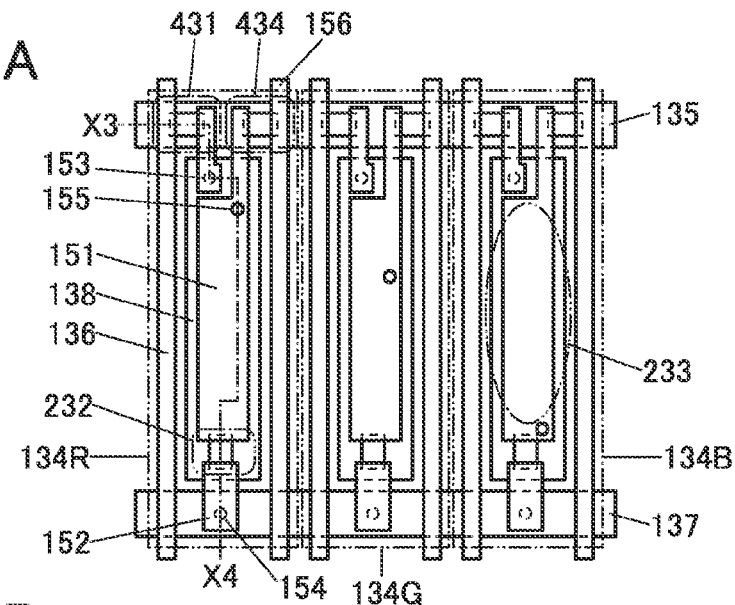
FIGS. 5A to 5C illustrate pixel structure examples.
Figure 5B:
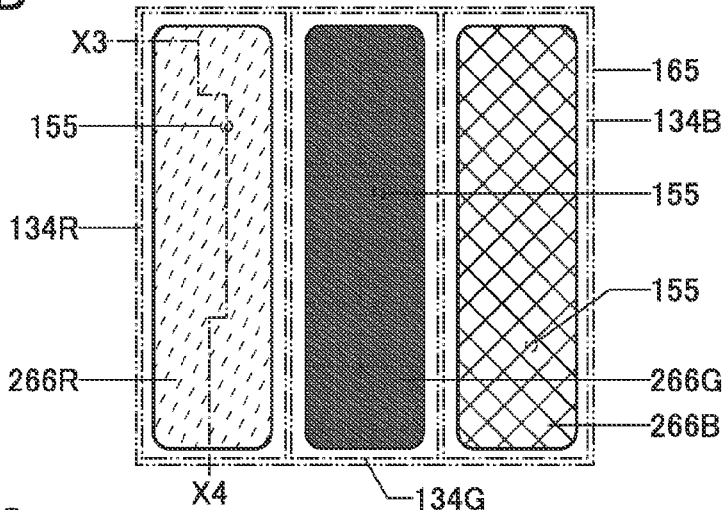
Figure 6:
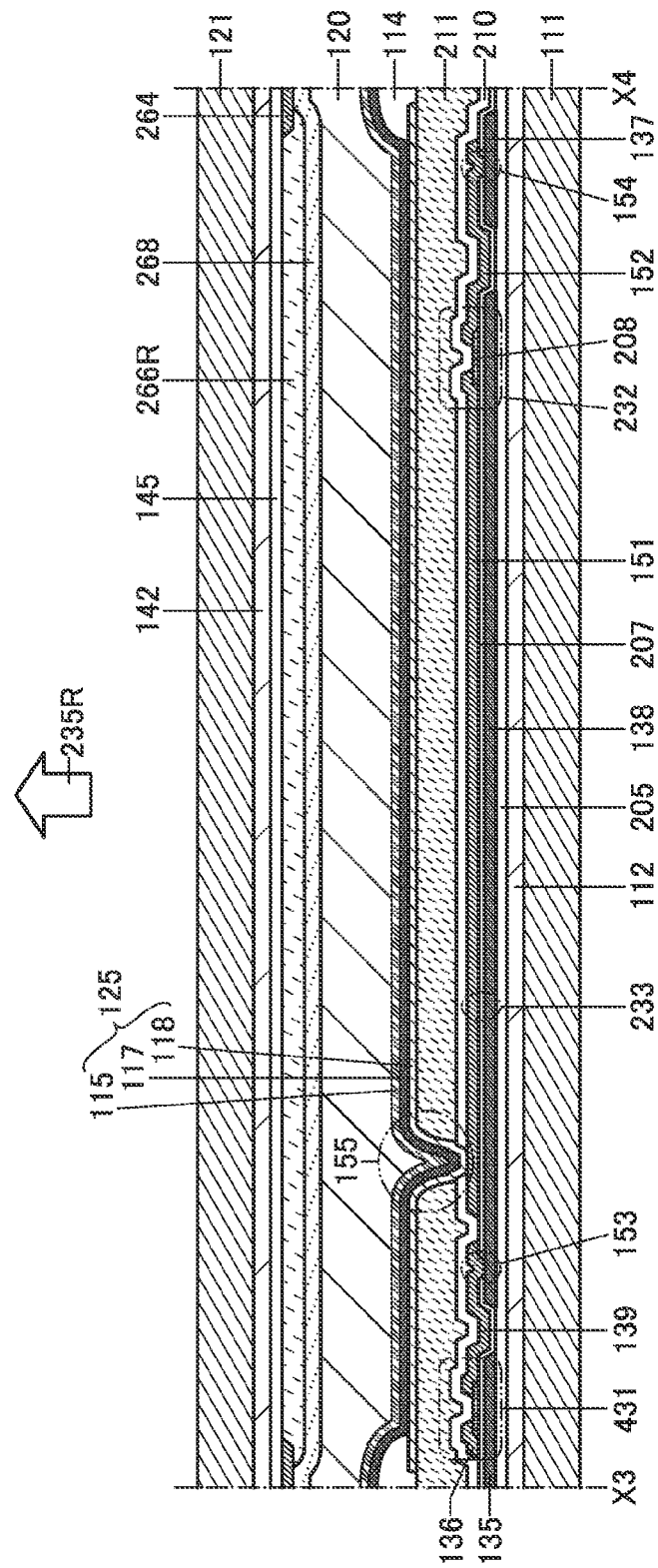
FIG. 6 is a cross-sectional view illustrating a pixel structure example.

First, a structure example of the pixel 165 is described. FIGS. 5A and 5B are enlarged plan views of the pixel 165. For easy understanding, FIG. 5A does not illustrate the light-emitting element 125, the coloring layer 266, and the like. For the same reason, FIG. 5B does not illustrate the pixel circuit 134 and the like. FIG. 6 is a cross-sectional view of a portion X3-X4 indicated by alternate long and short dash lines in FIGS. 5A and 5B.

As described above, one pixel circuit 134 can be used for driving one subpixel. Thus, at least three pixel circuits 134 are used for driving the pixel 165. In FIG. 5A, three pixel circuits 134 for driving the pixel 165 are referred to as pixel circuits 134R, 134G, and 134B. In the pixel 165, the longitudinal direction of the pixel circuit 134 substantially corresponds to the longitudinal directions of the light-emitting element 125 and the coloring layer 266. The coloring layer 266R of the pixel 165 overlaps the pixel circuit 134R. The coloring layer 266G overlaps the pixel circuit 134G. The coloring layer 266B overlaps the pixel circuit 134B. The pixel circuit 134R is used for driving the coloring layer 266R. The pixel circuit 134G is used for driving the coloring layer 266G. The pixel circuit 134B is used for driving the coloring layer 266B.

The wiring 135 in FIG. 5A and FIG. 6 corresponds to the scan line GL_m. Part of the wiring 135 corresponds to the gate electrode 206 and functions as the gate electrodes of the transistors 431 and 434. Part of a wiring 138 functions as one electrode of the capacitor 233, and the other part of the wiring 138 functions as the gate electrode of the transistor 232. A wiring 137 corresponds to the potential supply line VL_a. The wirings 135, 138, and 137 can be formed using a material and a method similar to those of the gate electrode 206.

The gate insulating layer 207 is formed over the wirings 135, 138, and 137. The gate insulating layer 207 over the wiring 138 functions as a dielectric layer of the capacitor 233. Wirings 136, 139, 151, 152, and 156 are formed over the gate insulating layer 207 and the semiconductor layer 208 (see FIG. 5A and FIG. 6). The wiring 136 corresponds to the signal line DL_n. Part of the wiring 136 functions as one of the source electrode and the drain electrode of the transistor 431. The wiring 139 is electrically connected to the wiring 138 through an opening 153 formed in the gate insulating layer 207. The wiring 139 functions as the other of the source electrode and the drain electrode of the transistor 431. The wiring 156 corresponds to the potential supply line V0. Part of the wiring 156 functions as one of the source electrode and the drain electrode of the transistor 434. Part of the wiring 151 functions as the other of the source electrode and the drain electrode of the transistor 434.

The wiring 151 functions as the other electrode of the capacitor 233. The wiring 152 is electrically connected to the wiring 137 through an opening 154 formed in the gate insulating layer 207. The wiring 152 functions as one of the source electrode and the drain electrode of the transistor 232. The wiring 151 functions as the other of the source electrode and the drain electrode of the transistor 232. The wirings 136, 139, 151, 152, and 156 can be formed using a material and a method similar to those of the source electrode 209a and the drain electrode 209b.

The insulating layer 210 is formed over the wirings 136, 139, 151, 152, and 156, and the insulating layer 211 is formed over the insulating layer 210. The electrode 118 formed over the insulating layer 211 is electrically connected to the wiring 151 through an opening 155 formed in the insulating layers 210 and 211. This means that the light-emitting element 125 is electrically connected to the wiring 151.

Light emitted from the light-emitting element 125 is converted by the coloring layer 266R to be light 235R. Note that the description of other components is omitted because such components are described in detail in other embodiments.
[Structure Example of Pixel 175]

Figure 5C:
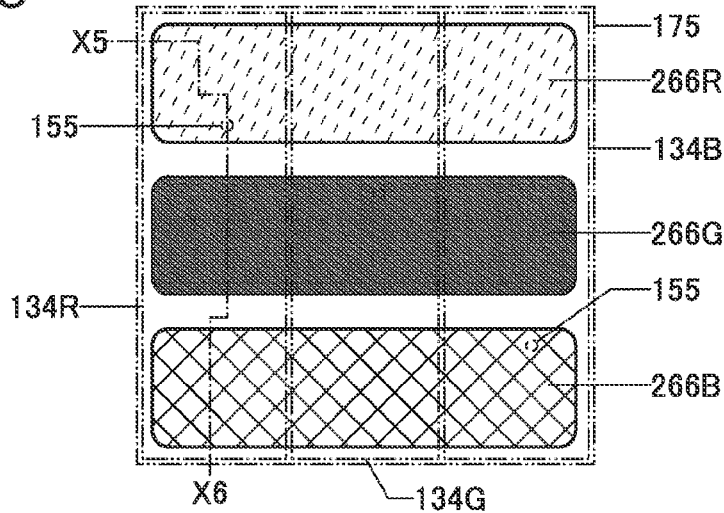

Next, a structure example of the pixel 175 is described. FIG. 5C is an enlarged plan view of the pixel 175. For easy understanding, FIG. 5C does not illustrate the light-emitting element 125, the coloring layer 266, and the like.

Figure 7:
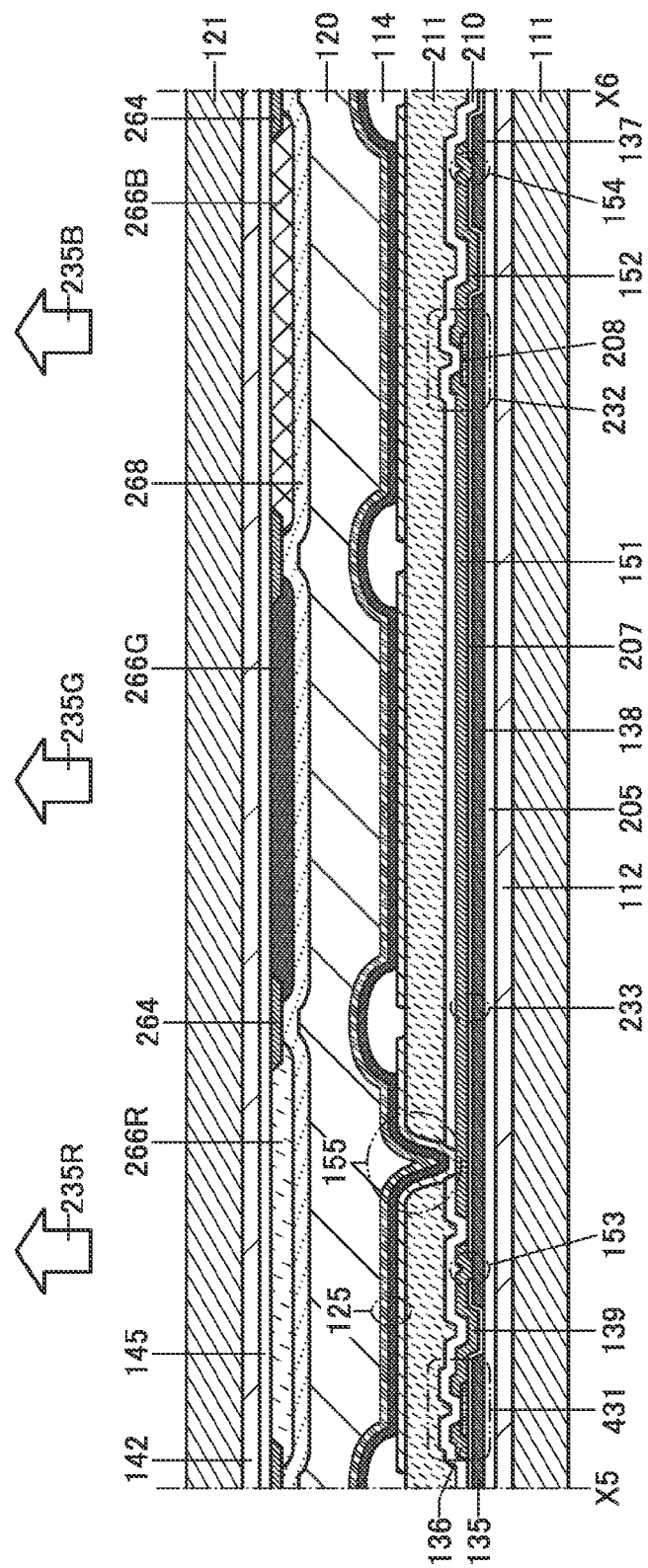
FIG. 7 is a cross-sectional view illustrating a pixel structure example.

The pixel 175 can be obtained by rotating the light-emitting element 125 and the coloring layer 266 of the pixel 165 90 degrees to have V arrangement. In that case, the arrangement of the pixel circuits 134 is H arrangement. FIG. 7 is a cross-sectional view of a portion X5-X6 indicated by alternate long and short dash lines in FIG. 5C.

In the display device 100 according to one embodiment of the present invention, it is not necessary to change the structure of the pixel circuit 134 between the pixels 165 and 175. Thus, it is not necessary to change the driving method between the regions 160 and 170. When a plurality of driver circuits or driving methods are used in the display region 131, manufacturing yield is likely to be decreased or manufacturing cost is likely to be increased. This leads to a decrease in productivity of the display device. According to one embodiment of the present invention, it is possible to achieve a display device having high productivity and high display quality.

[Modification Example of Pixel Structure]

Figure 8:
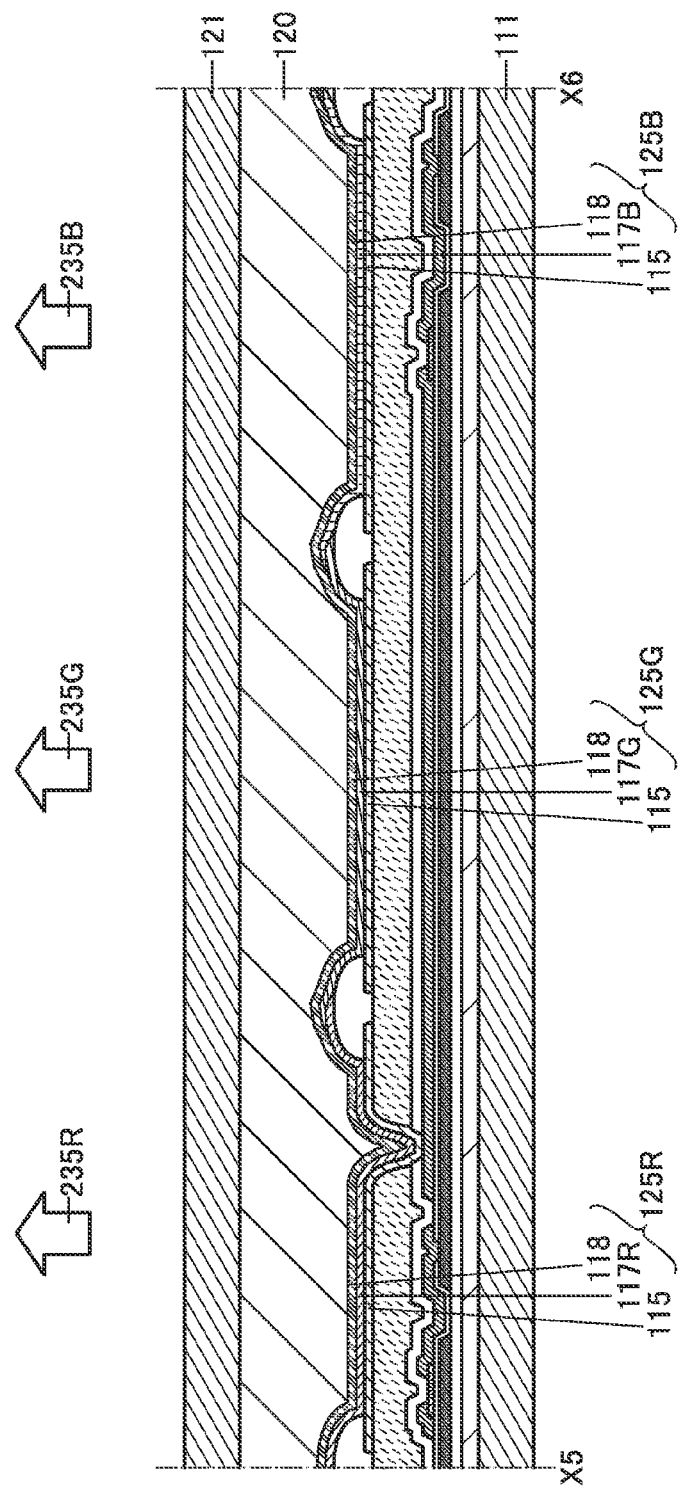
FIG. 8 is a cross-sectional view illustrating a pixel structure example.

Note that it is possible not to provide the coloring layer 266, the light-blocking layer 264, the overcoat layer 268, and the like. In that case, a color image can be displayed by replacing the light-emitting element 125 that emits white light with a light-emitting element 125R that emits red light, a light-emitting element 125G that emits green light, a light-emitting element 125B that emits blue light, or the like in each sub-pixel. FIG. 8 illustrates an example in which the coloring layer 266 and the like are not used.

The light-emitting elements 125R, 125G, and 125B include EL layers 117R, 117G, and 117B, respectively. The EL layers 117R, 117G, and 117B can emit lights of different colors, for example, the red light 235R, green light 235G, and blue light 235B. The non-use of the coloring layer 266 and the like in this manner can improve color purity and reduce the amount of light loss.

This embodiment can be combined with any of the structures described in the other embodiments as appropriate.

Embodiment 5

In this embodiment, an example of a method for manufacturing the display device 100 is described with reference to FIGS. 9A to 9D, FIGS. 10A to 10D, FIGS. 11A and 11B, FIGS. 12A and 12B, FIGS. 13A and 13B, FIGS. 14A and 14B, and FIGS. 15A to 15D. Note that FIGS. 9A to 9D, FIGS. 10A to 10D, FIGS. 11A and 11B, FIGS. 12A and 12B, FIGS. 13A and 13B, and FIGS. 14A and 14B are cross-sectional views of the portion X1-X2 indicated by the alternate long and short dash lines in FIG. 1A.

[Formation of Separation Layer]

Figure 9A:
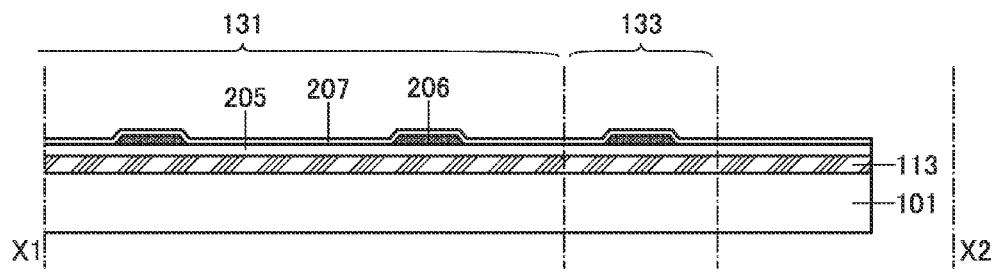
FIGS. 9A to 9D are cross-sectional views illustrating an example of a method for manufacturing a display device.
Figure 9B:
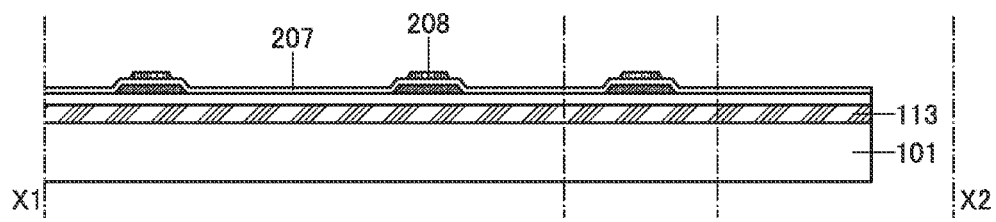

First, a separation layer 113 is formed over an element formation substrate 101 (see FIG. 9A). Note that the element formation substrate 101 can be a glass substrate, a quartz substrate, a sapphire substrate, a ceramic substrate, a metal substrate, or the like. Alternatively, a plastic substrate that can withstand the processing temperature of this embodiment may be used.

For the glass substrate, a glass material such as aluminosilicate glass, aluminoborosilicate glass, or barium borosilicate glass is used, for example. Note that by containing a large amount of barium oxide (BaO), the glass substrate can be heat-resistant and more practical. Alternatively, crystallized glass or the like can be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of these elements; or a compound material containing any of these elements. The separation layer 113 can also be formed to have a single-layer structure or a layered structure of any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by sputtering, CVD, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a layered structure including, for example, a layer containing tungsten and a layer containing an oxide of tungsten, the layer containing an oxide of tungsten may be formed as follows: the layer containing tungsten is formed first and then an oxide insulating layer is formed in contact the layer containing tungsten, so that the layer containing an oxide of tungsten is formed at an interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on a surface of the layer containing tungsten.

In this embodiment, the separation layer 113 is formed using tungsten by sputtering.

[Formation of Insulating Layer]

Next, the insulating layer 205 is formed as a base layer over the separation layer 113 (see FIG. 9A). The insulating layer 205 is preferably formed using a single layer or a multilayer of any of silicon oxide, silicon nitride, silicon oxynitride, silicon nitride oxide, aluminum oxide, aluminum oxynitride, and aluminum nitride oxide. The insulating layer 205 may have, for example, a two-layer structure of silicon oxide and silicon nitride or a five-layer structure in which materials selected from the above are combined. The insulating layer 205 can be formed by sputtering, CVD, thermal oxidation, a coating method, a printing method, or the like.

The thickness of the insulating layer 205 may be 30 to 500 nm, preferably 50 to 400 nm.

The insulating layer 205 can prevent or reduce diffusion of impurity elements from the element formation substrate 101, the separation layer 113, or the like. Even after the element formation substrate 101 is replaced with the substrate 111, the insulating layer 205 can prevent or reduce diffusion of impurity elements into the light-emitting element 125 from the substrate 111, the bonding layer 112, or the like. In this embodiment, the insulating layer 205 is formed by stacking a 200-nm-thick silicon oxynitride film and a 50-nm-thick silicon nitride oxide film by plasma-enhanced CVD.

[Formation of Gate Electrode]

Next, the gate electrode 206 is formed over the insulating layer 205 (see FIG. 9A). The gate electrode 206 can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The gate electrode 206 may have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in that order, or the like can be used. Alternatively, an alloy film or a nitride film that contains aluminum and one or more metals selected from titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the light-transmitting conductive material and the metal element.

First, a conductive film to be the gate electrode 206 is stacked over the insulating layer 205 by CVD such as plasma-enhanced CVD, LPCVD, or metal organic chemical vapor deposition (MOCVD), sputtering, vapor deposition, or the like. Then, a resist mask is formed over the conductive film by a photolithography process. When the conductive film to be the gate electrode 206 is formed by MOCVD, damage to a surface where the conductive film is formed can be reduced. Next, part of the conductive film to be the gate electrode 206 is etched using the resist mask to form the gate electrode 206. At the same time, a wiring and another electrode can be formed.

The conductive film may be etched by dry etching, wet etching, or both dry etching and wet etching. In the case where the conductive film is etched by dry etching, ashing treatment before removal of the resist mask facilitates removal of the resist mask using a stripper.

Note that the gate electrode 206 may be formed by an electrolytic plating method, a printing method, an inkjet method, or the like instead of the above formation method.

The thickness of the gate electrode 206 is 5 to 500 nm, preferably 10 to 300 nm, more preferably 10 to 200 nm.

When the gate electrode 206 may be formed using a light-blocking conductive material, external light can be prevented from reaching the semiconductor layer 208 from the gate electrode 206 side. As a result, variations in electrical characteristics of the transistor due to light irradiation can be reduced.

[Formation of Gate Insulating Layer]

Next, the gate insulating layer 207 is formed (see FIG. 9A). The gate insulating layer 207 can be formed to have a layered structure or a single-layer structure of, for example, any of silicon oxide, silicon oxynitride, silicon nitride oxide, silicon nitride, aluminum oxide, a mixture of aluminum oxide and silicon oxide, hafnium oxide, gallium oxide, and a Ga—Zn-based metal oxide.

When the gate insulating layer 207 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage of the transistor can be reduced. For example, a stacked layer of silicon oxynitride and hafnium oxide may be used.

The thickness of the gate insulating layer 207 is 5 to 400 nm, preferably 10 to 300 nm, more preferably 50 to 250 nm.

The gate insulating layer 207 can be formed by sputtering, CVD, vapor deposition, or the like.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

The gate insulating layer 207 can have a layered structure in which a nitride insulating layer and an oxide insulating layer are stacked in that order from the gate electrode 206 side. When the nitride insulating layer is provided on the gate electrode 206 side, hydrogen, nitrogen, an alkali metal, an alkaline earth metal, or the like can be prevented from moving from the gate electrode 206 side to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, the term "impurity" in this specification and the like means hydrogen, nitrogen, an alkali metal, an alkaline earth metal, or the like.

In the case where an oxide semiconductor is used for the semiconductor layer 208, the density of defect states at an interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen at a proportion higher than that in the stoichiometric composition is preferably formed as the oxide insulating layer. This is because the density of defect states at the interface between the gate insulating layer 207 and the semiconductor layer 208 can be further reduced.

In the case where the gate insulating layer 207 is a stacked layer of a nitride insulating layer and an oxide insulating layer as described above, the nitride insulating layer is preferably thicker than the oxide insulating layer.

The nitride insulating layer has a higher dielectric constant than the oxide insulating layer; thus, an electric field generated from the gate electrode 206 can be efficiently transmitted to the semiconductor layer 208 even when the gate insulating layer 207 has large thickness. When the gate insulating layer 207 has large total thickness, the breakdown voltage of the gate insulating layer 207 can be increased. Accordingly, the reliability of the semiconductor device can be improved.

The gate insulating layer 207 can have a layered structure in which a first nitride insulating layer with few defects, a second nitride insulating layer with a high blocking property against hydrogen, and an oxide insulating layer are stacked in that order from the gate electrode 206 side. When the first nitride insulating layer with few defects is used in the gate insulating layer 207, the breakdown voltage of the gate insulating layer 207 can be improved. In addition, when the second nitride insulating layer with a high blocking property against hydrogen is used in the gate insulating layer 207, hydrogen contained in the gate electrode 206 and the first nitride insulating layer can be prevented from moving to the semiconductor layer 208.

An example of a method for forming the first and second nitride insulating layers is described below. First, a silicon nitride film with few defects is formed as the first nitride insulating layer by plasma-enhanced CVD in which a mixed gas of silane, nitrogen, and ammonia is used as a source gas. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against hydrogen are stacked can be formed.

The gate insulating layer 207 can have a layered structure in which a third nitride insulating film with a high blocking property against impurities, the first nitride insulating layer with few defects, the second nitride insulating layer with a high blocking property against hydrogen, and the oxide insulating layer are stacked in that order from the gate electrode 206 side. When the third nitride insulating layer with a high blocking property against impurities is provided in the gate insulating layer 207, hydrogen, nitrogen, an alkali metal, an alkaline earth metal, or the like can be prevented from moving from the gate electrode 206 to the semiconductor layer 208.

An example of a method for forming the first to third nitride insulating layers is described below. First, a silicon nitride film with a high blocking property against impurities is formed as the third nitride insulating layer by plasma-enhanced CVD in which a mixed gas of silane, nitrogen, and ammonia is used as a source gas. Next, a silicon nitride film with few defects is formed as the first nitride insulating layer by increasing the flow rate of ammonia. Then, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against impurities are stacked can be formed.

Furthermore, in the case where a gallium oxide film is formed as the gate insulating layer 207, MOCVD can be employed.

Note that the threshold voltage of a transistor can be changed by stacking the semiconductor layer 208 in which a channel of the transistor is formed and an insulating layer containing hafnium oxide with an oxide insulating layer positioned therebetween and injecting electrons into the insulating layer containing hafnium oxide.

[Formation of Semiconductor Layer]

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor; or the like can be used. The semiconductor layer 208 can be formed by ALD, sputtering, a coating method, a printing method, or the like as well as CVD such as plasma-enhanced CVD, LPCVD, or MOCVD. When the semiconductor layer 208 is formed by MOCVD, damage to a surface where the semiconductor layer 208 is formed can be reduced.

The thickness of the semiconductor layer 208 is 3 to 200 nm, preferably 3 to 100 nm, more preferably 3 to 50 nm. In this embodiment, a 30-nm-thick oxide semiconductor film is formed as the semiconductor layer 208 by sputtering.

Next, a resist mask is formed over the oxide semiconductor film, and part of the conductive film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, manufacturing cost can be reduced.

The oxide semiconductor film may be etched by dry etching, wet etching, or both dry etching and wet etching. After the etching of the oxide semiconductor film, the resist mask is removed (see FIG. 9B).

[Formation of Source Electrode, Drain Electrode, and the Like]

Figure 9C:
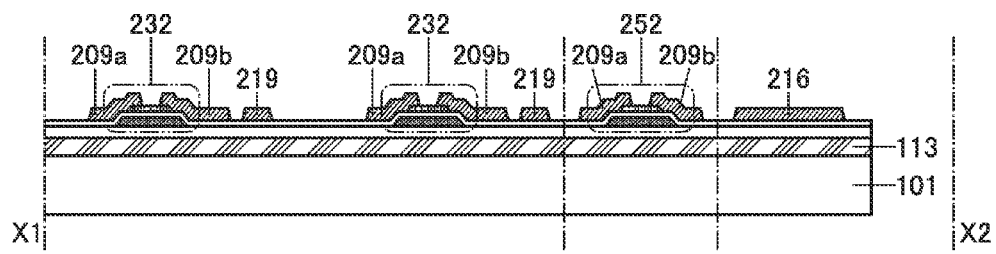

Next, the source electrodes 209a, the drain electrodes 209b, the wirings 219, and the terminal electrode 216 are formed (see FIG. 9C). First, a conductive film is formed over the gate insulating layer 207 and the semiconductor layer 208. The conductive film can be formed by CVD such as plasma-enhanced CVD, LPCVD, or MOCVD, ALD, sputtering, vapor deposition, a coating method, a printing method, or the like. When the conductive film is formed by MOCVD, damage to a surface where the conductive film is formed can be reduced.

The conductive film can have a single-layer structure or a layered structure containing any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in that order, a three-layer structure in which a molybdenum film or a molybdenum nitride film, an aluminum film or a copper film, and a molybdenum film or a molybdenum nitride film are stacked in that order, or a three-layer structure in which a tungsten film, a copper film, and a tungsten film are stacked in that order can be used.

Note that a conductive material containing oxygen, such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride may be used. It is also possible to use a layered structure formed using a material containing the above metal element and a conductive material containing oxygen. It is also possible to use a layered structure formed using a material containing the above metal element and a conductive material containing nitrogen. It is also possible to use a layered structure formed using a material containing the above metal element, a conductive material containing oxygen, and a conductive material containing nitrogen.

The thickness of the conductive film is 5 to 500 nm, preferably 10 to 300 nm, more preferably 10 to 200 nm. In this embodiment, a 300-nm-thick tungsten film is formed as the conductive film.

Then, part of the conductive film is selectively etched using a resist mask to form the source electrodes 209a, the drain electrodes 209b, the wirings 219, and the terminal electrode 216 (including other electrodes and wirings formed using the same layer). The resist mask can be formed by photolithography, a printing method, an inkjet method, or the like as appropriate. Formation of the resist mask by an inkjet method needs no photomask; thus, manufacturing cost can be reduced.

The conductive film may be etched by dry etching, wet etching, or both dry etching and wet etching. Note that an exposed portion of the semiconductor layer 208 is removed by the etching process in some cases.

After the etching of the conductive film, the resist mask is removed (see FIG. 9C).

[Formation of Insulating Layer]

Figure 9D:
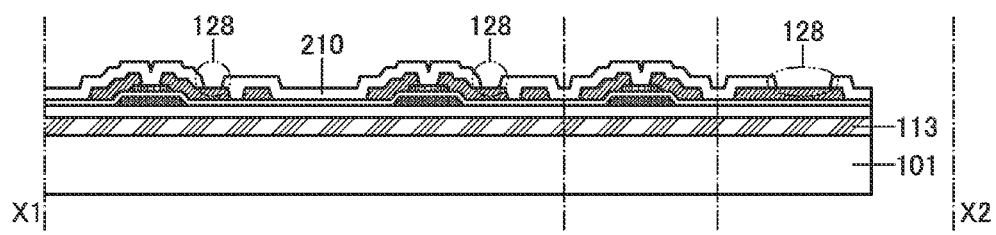

Next, the insulating layer 210 is formed over the source electrodes 209a, the drain electrodes 209b, the wirings 219, and the terminal electrode 216 (see FIG. 9D). The insulating layer 210 can be formed using a material and a method similar to those of the insulating layer 205.

In the case where an oxide semiconductor is used for the semiconductor layer 208, an insulating layer containing oxygen is preferably used for at least a region of the insulating layer 210 that is in contact with the semiconductor layer 208. For example, in the case where the insulating layer 210 is a stack of a plurality of layers, at least a layer that is in contact with the semiconductor layer 208 is preferably formed using silicon oxide.

[Formation of Opening]

Next, part of the insulating layer 210 is selectively etched using a resist mask to form openings 128 (see FIG. 9D). At the same time, another opening that is not illustrated is also formed. The resist mask can be formed by photolithography, a printing method, an inkjet method, or the like as appropriate. Formation of the resist mask by an inkjet method needs no photomask; thus, manufacturing cost can be reduced.

The insulating layer 210 may be etched by dry etching, wet etching, or both dry etching and wet etching.

The drain electrodes 209b and the terminal electrodes 216 are partly exposed by the formation of the openings 128. The resist mask is removed after the formation of the openings 128.

[Formation of Planarization Film]

Figure 10A:
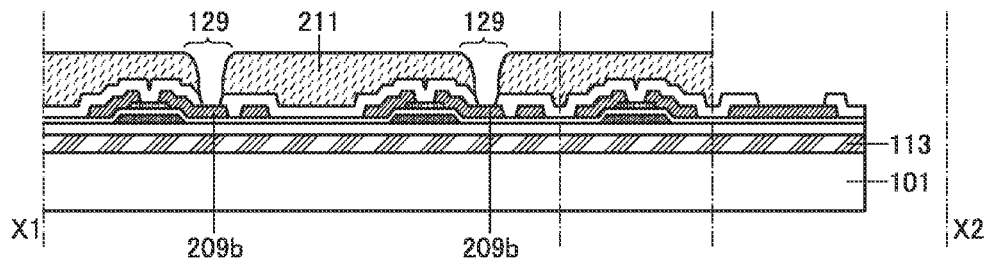
FIGS. 10A to 10D are cross-sectional views illustrating an example of the method for manufacturing a display device.

Next, the insulating layer 211 is formed over the insulating layer 210 (see FIG. 10A). The insulating layer 211 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can omit polishing treatment. As the insulating material with a planarization function, for example, an organic material such as a polyimide resin or an acrylic resin can be used. Other than such organic materials, it is possible to use a low-dielectric constant material (low-k material) or the like. Note that the insulating layer 211 may be formed by stacking a plurality of insulating layers formed using any of these materials.

Some of the insulating layer 211 that overlap the openings 128 are removed to form openings 129. At the same time, another opening that is not illustrated is also formed. In addition, the insulating layer 211 in a region to which the external electrode 124 is connected later is removed. Note that the openings 129 or the like can be formed in such a manner that a resist mask is formed by a photolithography process over the insulating layer 211 and a region of the insulating layer 211 that is not covered with the resist mask is etched. Surfaces of the drain electrodes 209b are exposed by the formation of the openings 129.

When the insulating layer 211 is formed using a photosensitive material, the openings 129 can be formed without the resist mask. In this embodiment, a photosensitive polyimide resin is used to form the insulating layer 211 and the openings 129.

[Formation of Anode]

Figure 10B:
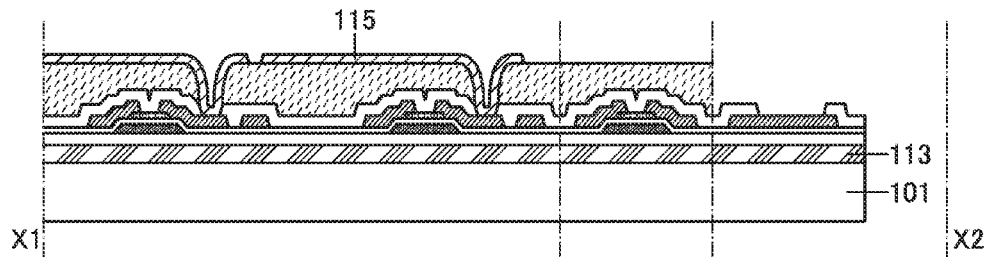

Next, the electrode 115 is formed over the insulating layer 211 (see FIG. 10B). The electrode 115 is preferably formed using a conductive material that efficiently reflects light emitted from the EL layer 117 formed later. Note that the electrode 115 may have a layered structure of a plurality of layers without limitation to a single-layer structure. For example, in the case where the electrode 115 is used as an anode, a layer that is in contact with the EL layer 117 may be a light-transmitting layer, such as an indium tin oxide layer, having a higher work function than the EL layer 117, and a layer having high reflectance (e.g., aluminum, an alloy containing aluminum, or silver) may be provided in contact with the layer.

Note that although the display device having a top-emission structure is described in this embodiment, a display device having a bottom-emission structure or a dual-emission structure can be used.

In the case where the display device 100 has a bottom-emission structure or a dual-emission structure, the electrode 115 is preferably formed using a light-transmitting conductive material.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by dry etching, wet etching, or both dry etching and wet etching. The resist mask can be formed by photolithography, a printing method, an inkjet method, or the like as appropriate. Formation of the resist mask by an inkjet method needs no photomask; thus, manufacturing cost can be reduced. The resist mask is removed after the formation of the electrode 115.

[Formation of Partition]

Figure 10C:
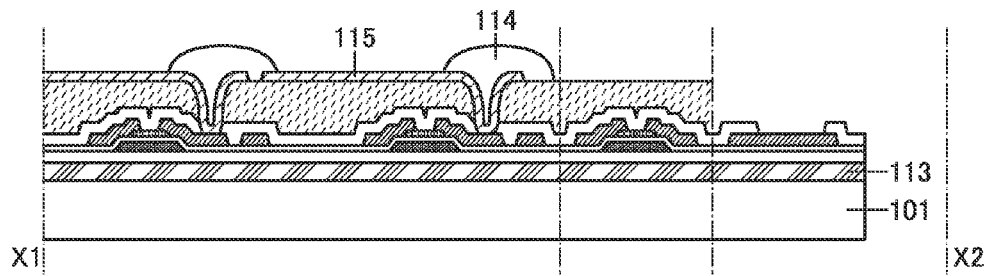
Figure 10D:
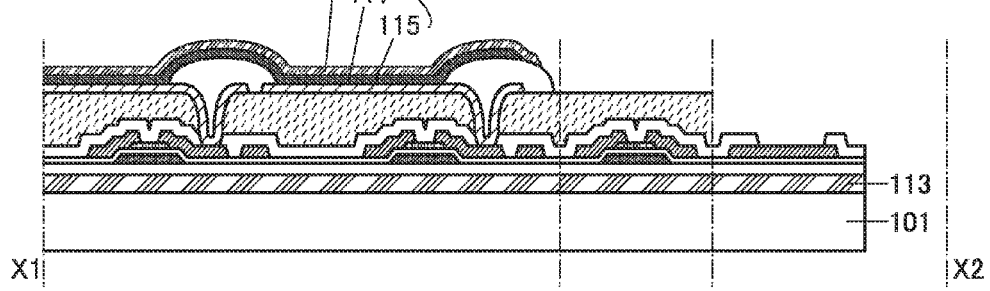

Next, the partition 114 is formed (see FIG. 10C). The partition 114 is provided to prevent unintended electrical short-circuit between the light-emitting elements 125 in adjacent pixels and unintended light emission from the light-emitting elements 125. In the case where a metal mask is used for formation of the EL layer 117 described later, the partition 114 has a function of preventing the contact of the metal mask with the electrode 115. The partition 114 can be formed using an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above shape enables favorable coverage with the EL layer 117 and the electrode 118 formed later.

[Formation of EL Layer]

The structure of the EL layer 117 is described in Embodiment 7.

[Formation of Cathode]

The electrode 118 is used as a cathode in this embodiment; thus, the electrode 118 is preferably formed using a material that has a low work function and can inject electrons into the EL layer 117 described later. As well as a single layer of a metal having a low work function, a stack in which a metal material such as aluminum, a conductive oxide material such as indium tin oxide, or a semiconductor material is formed over a several-nanometer-thick buffer layer formed using an alkali metal or an alkaline earth metal having a low work function may be used as the electrode 118. As the buffer layer, an oxide of an alkaline earth metal, a halide, a magnesium-silver alloy, or the like can also be used.

In the case where light emitted from the EL layer 117 is extracted through the electrode 118, the electrode 118 preferably transmits visible light. The light-emitting element 125 includes the electrode 115, the EL layer 117, and the electrode 118 (see FIG. 10D).

[Formation of Counter Element Formation Substrate]

Figure 11A:
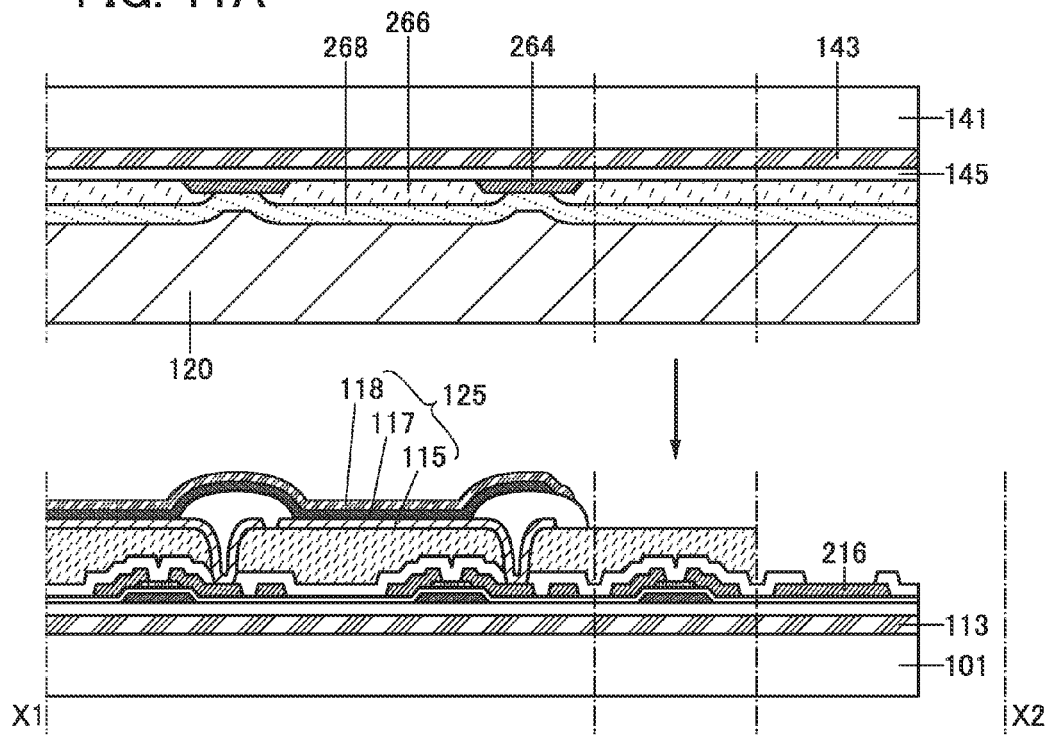
FIGS. 11A and 11B are cross-sectional views illustrating an example of the method for manufacturing a display device.

An element formation substrate 141 provided with the light-blocking layer 264, the coloring layer 266, the overcoat layer 268, the insulating layer 145, and a separation layer 143 is formed over the element formation substrate 101 with the bonding layer 120 positioned therebetween (see FIG. 11A). Note that the element formation substrate 141 is formed to face the element formation substrate 101 and may thus be referred to as a counter element formation substrate. The structure of the element formation substrate 141 (counter element formation substrate) is described later.

The bonding layer 120 is in contact with the electrode 118. The element formation substrate 141 is fixed by the bonding layer 120. A light curable adhesive, a reactive curable adhesive, a thermosetting adhesive, or an anaerobic adhesive can be used as the bonding layer 120. For example, an epoxy resin, an acrylic resin, an imide resin, or the like can be used. A drying agent (e.g., zeolite) having a size of less than or equal to the wavelength of light or a filler (e.g., titanium oxide or zirconium) with a high refractive index is preferably mixed into the bonding layer 120 in the case of a top-emission structure because the efficiency of extracting light emitted from the EL layer 117 can be improved.

[Separation of Element Formation Substrate from Insulating Layer]

Figure 11B:
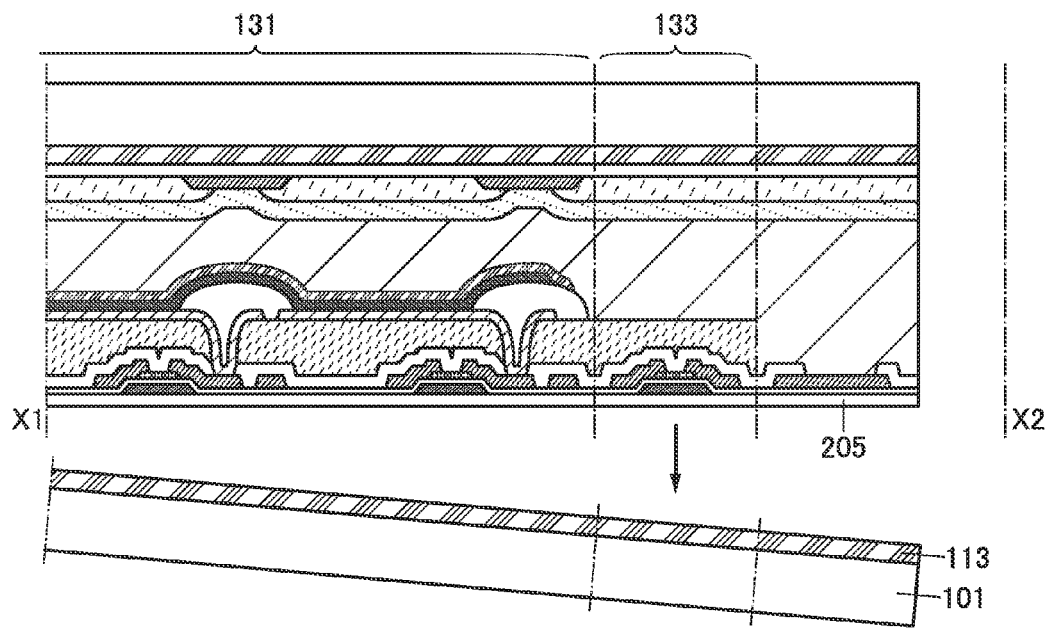

Next, the element formation substrate 101 attached to the insulating layer 205 with the separation layer 113 positioned therebetween is separated from the insulating layer 205 (see FIG. 11B). As a separation method, mechanical force (e.g., a separation process with a human hand or a gripper, a separation process by rotation of a roller, or ultrasonic wave treatment) may be used. For example, a cut is made in the separation layer 113 with a sharp edged tool, by laser light irradiation, or the like and water is injected into the cut. Alternatively, the cut is sprayed with water. A portion between the separation layer 113 and the insulating layer 205 absorbs water through capillarity action, so that the element formation substrate 101 can be separated easily from the insulating layer 205.

[Bonding of Substrate]

Figure 12A:
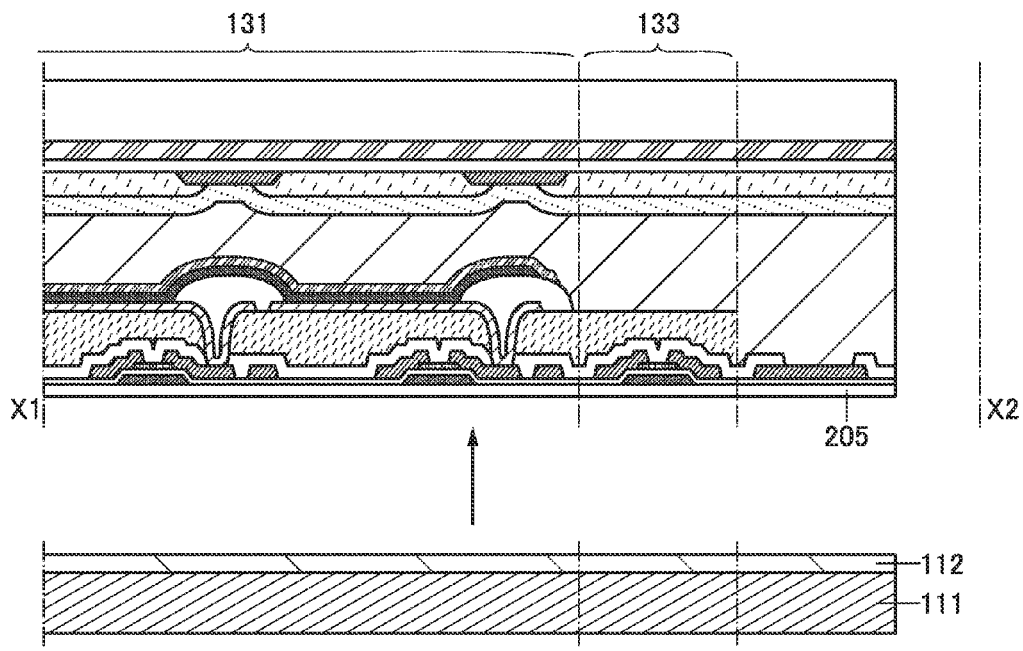
FIGS. 12A and 12B are cross-sectional views illustrating an example of the method for manufacturing a display device.
Figure 12B:
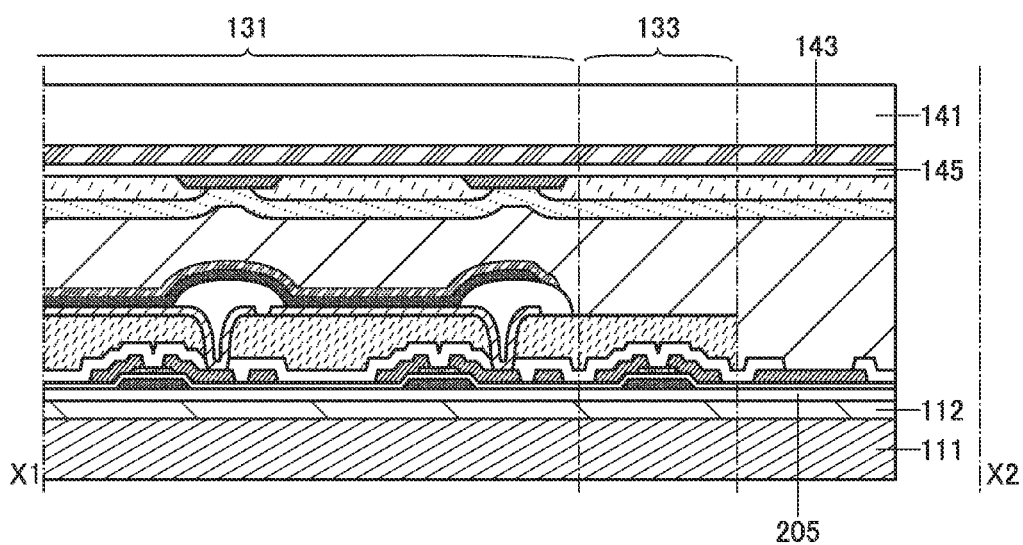

Next, the substrate 111 is bonded to the insulating layer 205 with the bonding layer 112 positioned therebetween (see FIGS. 12A and 12B). The bonding layer 112 can be formed using a material similar to that of the bonding layer 120.

[Separation of Counter Element Formation Substrate from Insulating Layer]

Figure 13A:
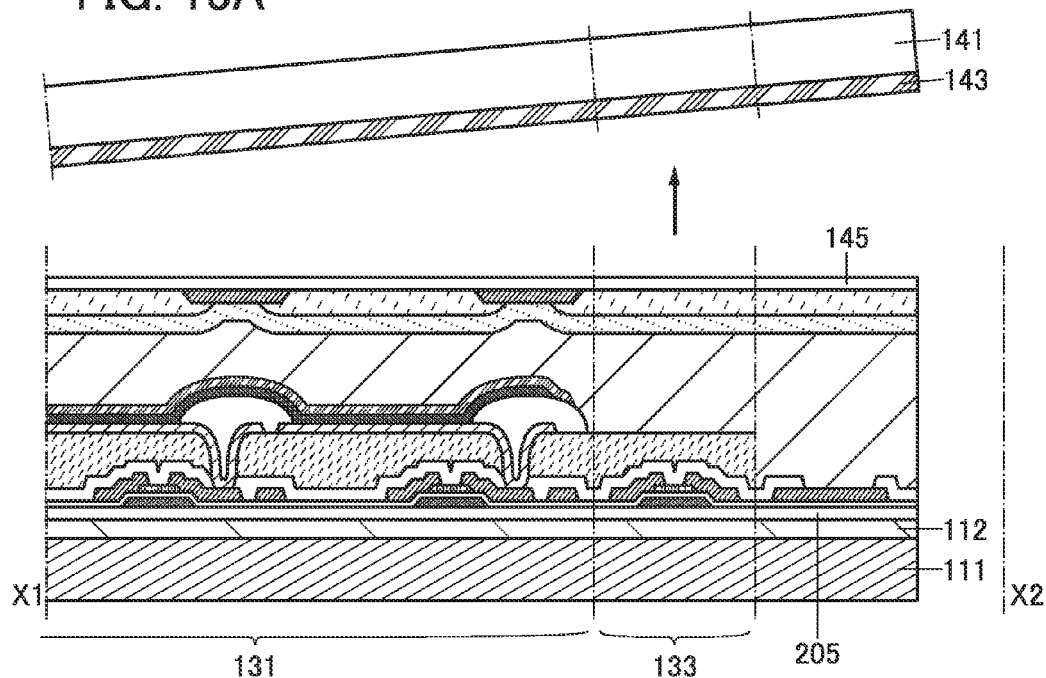
FIGS. 13A and 13B are cross-sectional views illustrating an example of the method for manufacturing a display device.

Next, the element formation substrate 141 attached to the insulating layer 145 with the separation layer 143 positioned therebetween is separated from the insulating layer 145 (see FIG. 13A). The element formation substrate 141 can be separated by a method similar to the method for separating the element formation substrate 101.

[Bonding of Substrate]

Figure 13B:
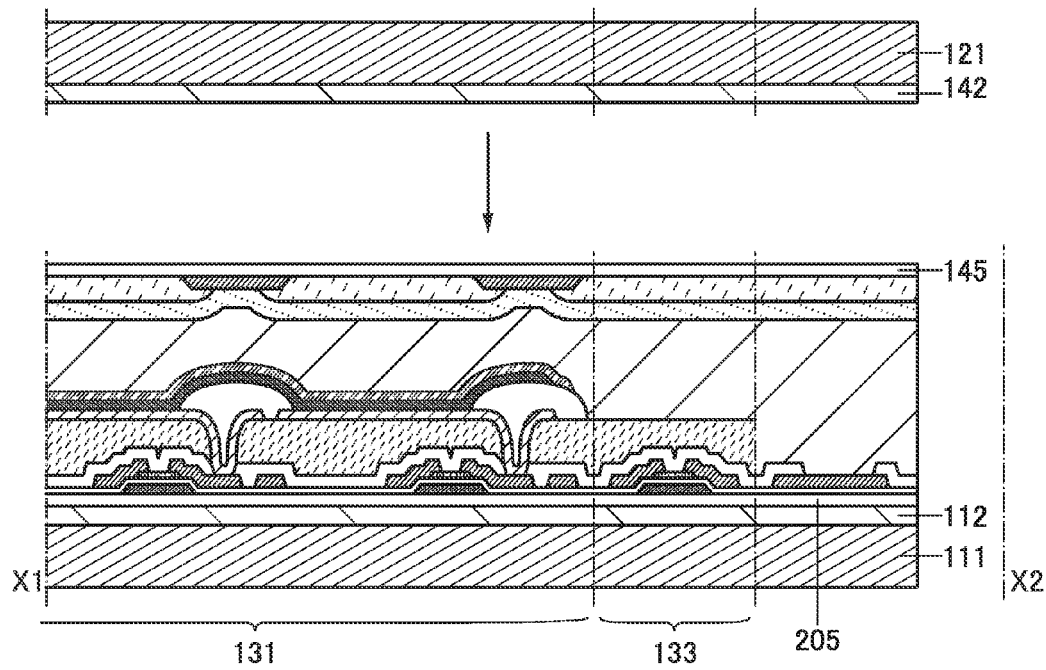

Next, the substrate 121 is bonded to the insulating layer 145 with the bonding layer 142 positioned therebetween (see FIG. 13B). The bonding layer 142 can be formed using a material similar to that of the bonding layer 120.

[Formation of Opening]

Figure 14A:
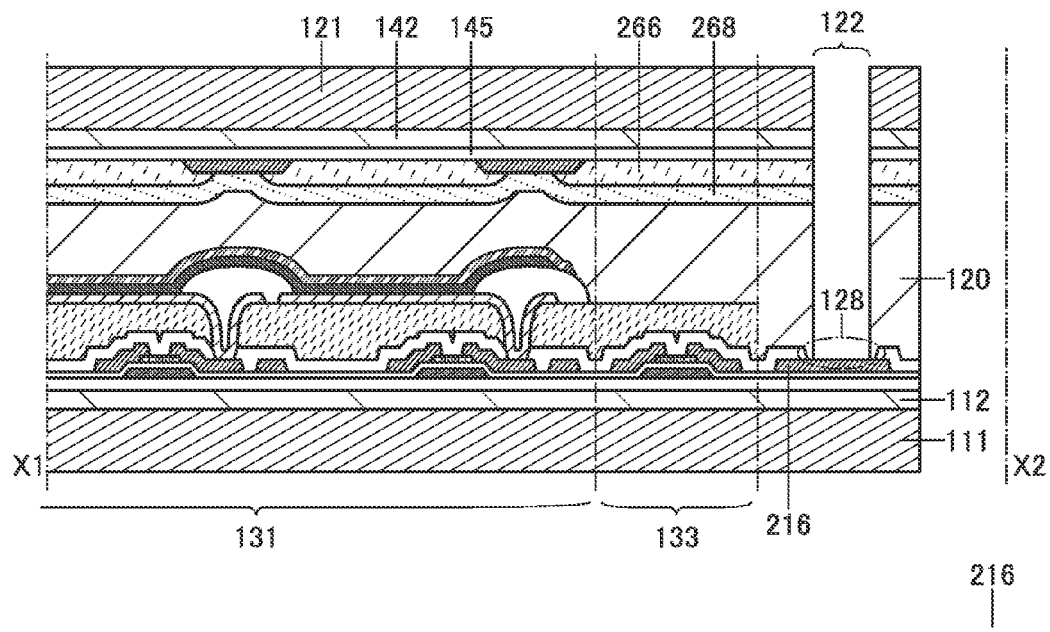
FIGS. 14A and 14B are cross-sectional views illustrating an example of the method for manufacturing a display device.

Next, the substrate 121, the bonding layer 142, the insulating layer 145, the coloring layer 266, the overcoat layer 268, and the bonding layer 120 in a region overlapping the terminal electrode 216 and the opening 128 are removed to form the opening 122 (see FIG. 14A). A surface of the terminal electrode 216 is partly exposed by the formation of the opening 122.

[Formation of External Electrode]

Figure 14B:
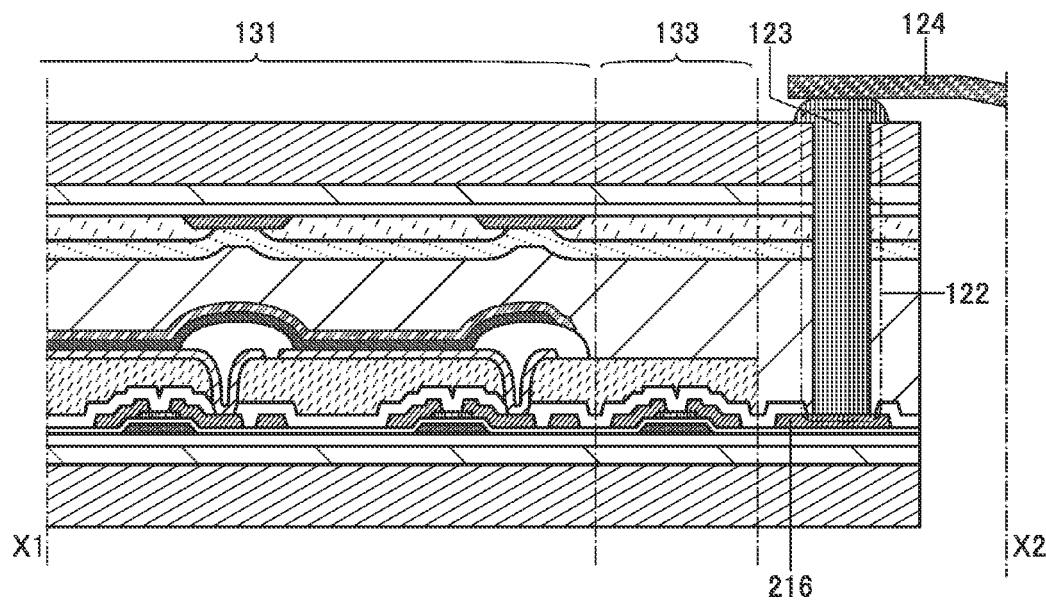

Next, the anisotropic conductive connection layer 123 is formed in the opening 122, and the external electrode 124 for inputting power or a signal to the display device 100 is formed over the anisotropic conductive connection layer 123 (see FIG. 14B). The terminal electrode 216 is electrically connected to the external electrode 124 through the anisotropic conductive connection layer 123. For example, a flexible printed circuit (FPC) can be used as the external electrode 124.

The anisotropic conductive connection layer 123 can be formed using any of various kinds of anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting and photo-curing resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

[Components Formed Over Counter Element Formation Substrate]

Next, components, such as the light-blocking layer 264, formed over the element formation substrate 141 are described with reference to FIGS. 15A to 15D.

First, the element formation substrate 141 is prepared. The element formation substrate 141 can be formed using a material similar to that of the element formation substrate 101. Then, the separation layer 143 and the insulating layer 145 are formed over the element formation substrate 141 (see FIG. 15A). The separation layer 143 can be formed using a material and a method similar to those of the separation layer 113. The insulating layer 145 can be formed using a material and a method similar to those of the insulating layer 205.

Figure 15A:
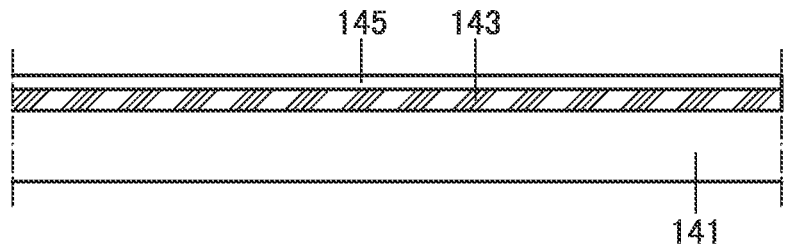
FIGS. 15A to 15D are cross-sectional views illustrating an example of the method for manufacturing a display device.
Figure 15B:
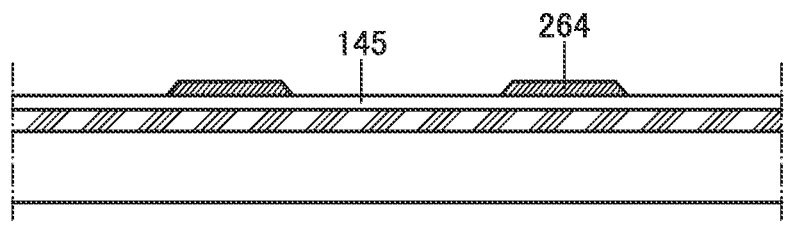
Figure 15C:
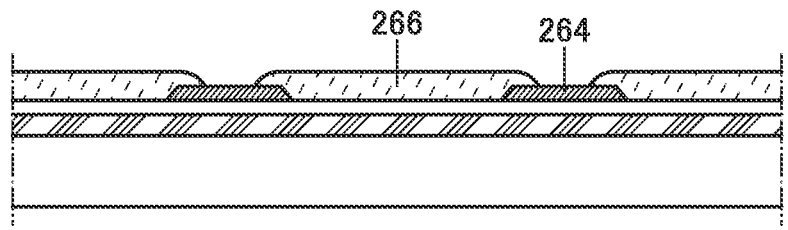

Next, the light-blocking layer 264 is formed over the insulating layer 145 (see FIG. 15B). After that, the coloring layer 266 is formed (see FIG. 15C).

The light-blocking layer 264 and the coloring layer 266 are each formed in a desired position with any of various materials by a printing method, an inkjet method, photolithography, or the like.

Figure 15D:
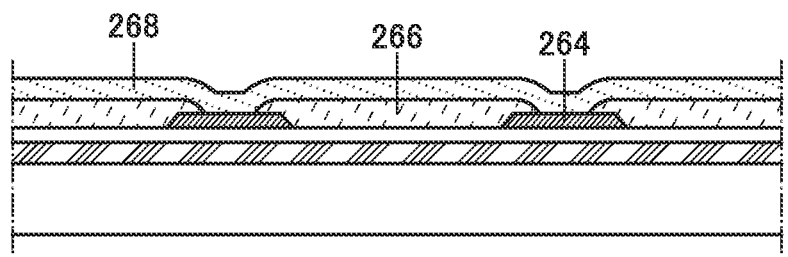

Next, the overcoat layer 268 is formed over the light-blocking layer 264 and the coloring layer 266 (see FIG. 15D).

For the overcoat layer 268, an organic insulating layer of an acrylic resin, an epoxy resin, polyimide resin, or the like can be used. With the overcoat layer 268, an impurity or the like contained in the coloring layer 266 can be inhibited from diffusing into the light-emitting element 125 side, for example. Note that the overcoat layer 268 is not necessarily formed.

A light-transmitting conductive film may be formed as the overcoat layer 268. The light-transmitting conductive film is formed as the overcoat layer 268, so that the light 235 emitted from the light-emitting element 125 can pass through the overcoat layer 268 and ionized impurities can be prevented from passing through the overcoat layer 268.

The light-transmitting conductive film can be formed using, for example, indium oxide, indium tin oxide (ITO), indium zinc oxide, zinc oxide, or zinc oxide to which gallium is added. Graphene or a metal film that is thin enough to have a light-transmitting property can also be used.

Through the above steps, the components such as the light-blocking layer 264 can be formed over the element formation substrate 141.

This embodiment can be combined with any of the structures described in the other embodiments as appropriate.

Embodiment 6

A display device 150 having a bottom-emission structure can be manufactured by modification of the structure of the display device 100 having a top-emission structure.

FIG. 16 illustrates a cross-sectional structure example of the display device 150 having a bottom-emission structure. Note that FIG. 16 is a cross-sectional view of a portion similar to the portion X1-X2 indicated by the alternate long and short dash line in FIG. 1A that is a perspective view of the display device 100. The display device 150 having a bottom-emission structure differs from the display device 100 in the position where the light-blocking layer 264, the coloring layer 266, and the overcoat layer 268 are formed. Specifically, in the display device 150, the light-blocking layer 264, the coloring layer 266, and the overcoat layer 268 are formed over the substrate 111.

In the display device 150, the substrate 121 on which the insulating layer 145 is directly formed can be bonded to the substrate 111 with the bonding layer 120 positioned therebetween. In other words, the insulating layer 145 does not need to be transferred from the element formation substrate 141; thus, the element formation substrate 141, the separation layer 143, and the bonding layer 142 are not needed. This can improve the productivity, yield, and the like of the display device. Note that other components of the display device 150 can be formed as in the case of the display device 100.

In the display device 150 having a bottom-emission structure, the electrode 115 is formed using a light-transmitting conductive material, and the electrode 118 is formed using a conductive material that efficiently reflects light emitted from the EL layer 117.

The wirings 138 and 151 (not illustrated in FIG. 16) used in the display device 150 having a bottom-emission structure are each preferably formed using a light-transmitting material.

In the display device 150, the light 235 emitted from the EL layer 117 can be extracted from the substrate 111 side through the coloring layer 266.

Note that the display device 150 is an example of a display device in which a transistor 272 is used as a transistor included in the driver circuit 133. Although the transistor 272 can be formed in a manner similar to that of the transistor 252, the transistor 272 differs from the transistor 252 in that an electrode 263 is formed over the insulating layer 210 in a region overlapping the semiconductor layer 208. The electrode 263 can be formed using a material and a method similar to those of the gate electrode 206.

The electrode 263 can function as a gate electrode. In the case where one of the gate electrode 206 and the electrode 263 is simply referred to as a gate electrode, the other of the gate electrode 206 and the electrode 263 is referred to as a back gate electrode in some cases. One of the gate electrode 206 and the electrode 226 is referred to as a first gate electrode, and the other of the gate electrode 206 and the electrode 226 is referred to as a second gate electrode in some cases.

In general, a back gate electrode is formed using a conductive film and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a GND potential or a given potential. By changing the potential of the back gate electrode, the threshold voltage of the transistor can be changed.

Furthermore, the gate electrode and the back gate electrode are formed using conductive films and thus each have a function of preventing an electric field generated outside the transistor from influencing the semiconductor layer in which a channel is formed (in particular, a function of blocking static electricity).

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and degradation in electrical characteristics of the transistor, such as a shift in the threshold voltage, can be prevented.

By providing the gate electrode 206 and the electrode 263 with the semiconductor layer 208 positioned therebetween and setting the potentials of the gate electrode 206 and the electrode 263 equal, a region of the semiconductor layer 208 through which carriers flow is enlarged in a film thickness direction; thus, the number of transferred carriers is increased. As a result, the on-state current and field-effect mobility of the transistor are increased.

The gate electrode 206 and the electrode 263 each have a function of blocking an external electric field; thus, electric charge in a layer below the gate electrode 206 and in a layer over the electrode 263 does not affect the semiconductor layer 208. Thus, there is little change in the threshold voltage in a stress test (e.g., a negative gate bias-temperature (−GBT) stress test in which negative voltage is applied to a gate or a +GBT stress test in which positive voltage is applied to a gate). In addition, changes in the rising voltage of on-state current at different drain voltages can be reduced.

The BT stress test is one kind of accelerated test and can evaluate, in a short time, changes in characteristics (i.e., changes over time) of transistors that are caused by long-term use. In particular, the amount of change in the threshold voltage of the transistor in the BT stress test is an important indicator when the reliability of the transistor is examined. If the amount of change in the threshold voltage in the BT stress test is small, the transistor has higher reliability.

By providing the gate electrode 206 and the electrode 263 and setting the potentials of the gate electrode 206 and the electrode 263 equal, the amount of change in the threshold voltage is reduced. Accordingly, variations in electrical characteristics among a plurality of transistors are also reduced.

Note that a back gate electrode may be provided in the transistor 232 formed in the display region 131.

Figure 22A:
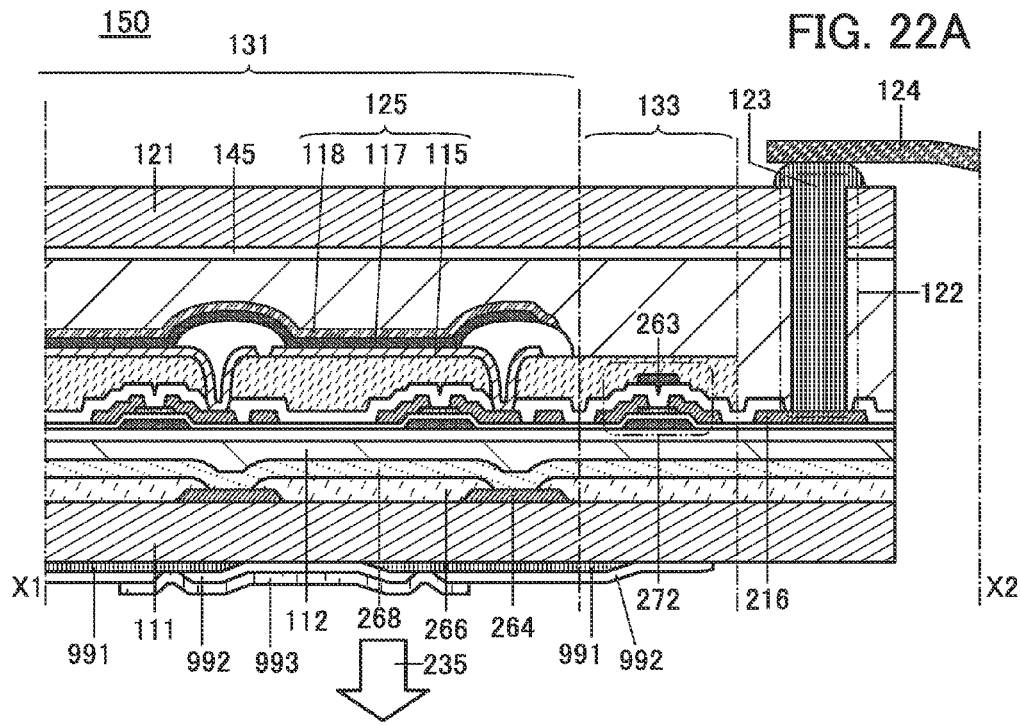
FIGS. 22A and 22B each illustrate one aspect of a display device.
Figure 22B:
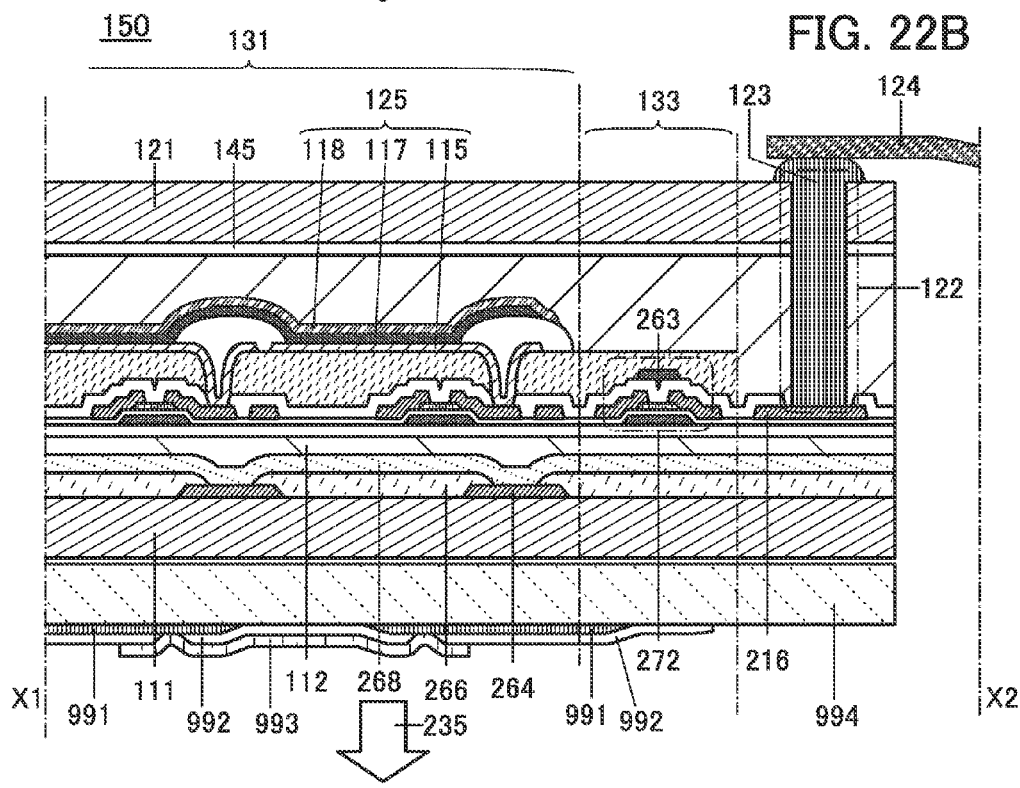

Note that as in FIGS. 21A and 21B, a touch sensor may be provided. FIGS. 22A and 22B illustrate examples of such a case.

This embodiment can be combined with any of the structures described in the other embodiments as appropriate.

Embodiment 7

In this embodiment, structure examples of a light-emitting element that can be used as the light-emitting element 125 are described. Note that an EL layer 320 described in this embodiment corresponds to the EL layer 117 described in the other embodiments.

<Structure of Light-Emitting Element>

Figure 17A:
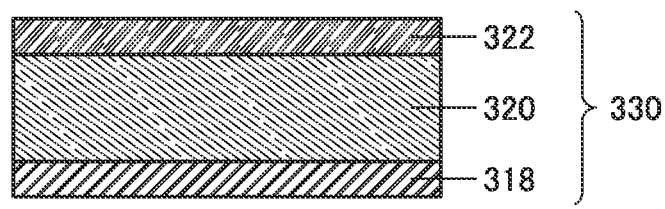
FIGS. 17A and 17B illustrate structure examples of light-emitting elements.

In a light-emitting element 330 in FIG. 17A, the EL layer 320 is sandwiched between a pair of electrodes (electrodes 318 and 322). Note that the electrode 318 is used as an anode and the electrode 322 is used as a cathode as an example in the following description of this embodiment.

The EL layer 320 includes at least a light-emitting layer and may have a layered structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, an electron-injection layer, and the like can be used in appropriate combination.

The light-emitting element 330 in FIG. 17A emits light when current flows because of a potential difference generated between the electrodes 318 and 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 17B:
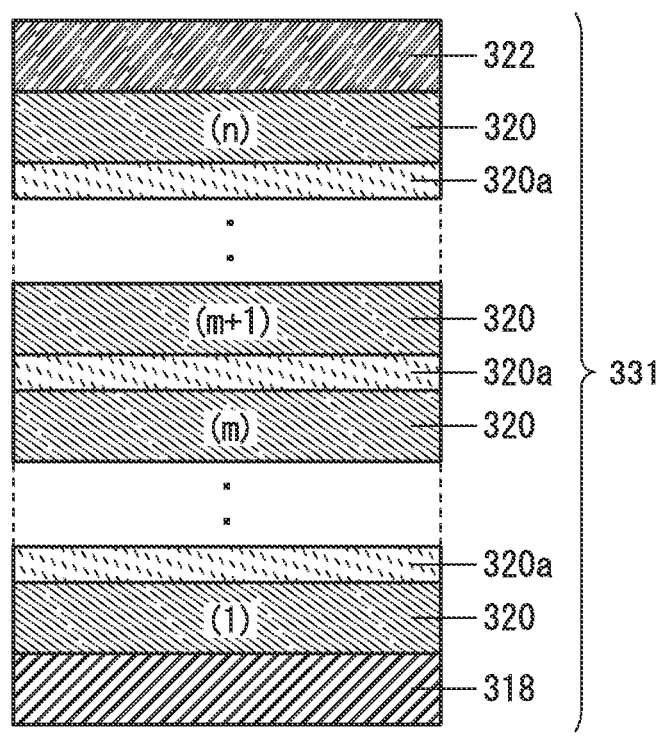

Note that a plurality of EL layers 320 may be stacked between the electrodes 318 and 322 as in a light-emitting element 331 in FIG. 17B. In the case where n (n is a natural number of 2 or more) layers are stacked, an electric charge generation layer 320a is preferably provided between an m-th EL layer 320 and an (m+1)th EL layer 320. Note that m is a natural number of greater than or equal to 1 and less than n.

The electric charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, or tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 330 can be driven with low current and with low voltage.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to have problems such as energy transfer and quenching and has an expanded choice of materials, and thus can easily have high emission efficiency and a long lifetime. Furthermore, it is easy to obtain phosphorescence from one light-emitting layer and fluorescence from the other light-emitting layer.

The electric charge generation layer 320a has a function of injecting electrons to one of the EL layers 320 that is in contact with the electric charge generation layer 320a and a function of injecting holes to the other EL layer 320 that is in contact with the electric charge generation layer 320a, when voltage is applied to the electrodes 318 and 322.

The light-emitting element 331 in FIG. 17B can provide a variety of emission colors by changing the type of the light-emitting substance used for the EL layer 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 17B, as for a combination of a plurality of EL layers, a structure for emitting white light including red light, blue light, and green light may be used. For example, the structure may include a light-emitting layer containing a blue fluorescent substance as a light-emitting substance and a light-emitting layer containing green and red phosphorescent substances as light-emitting substances. Alternatively, the structure may include a light-emitting layer emitting red light, a light-emitting layer emitting green light, and a third light-emitting layer emitting blue light. Alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors, the combinations of colors are as follows: blue and yellow, blue-green and red, and the like.

Note that in the structure of the above stacked-layer element, by providing the electric charge generation layer between the stacked light-emitting layers, the element can have long lifetime in a high-luminance region while keeping current density low. In addition, a voltage drop due to the resistance of an electrode material can be reduced, so that uniform light emission in a large area is possible.

This embodiment can be combined with any of the structures described in the other embodiments as appropriate.

Embodiment 8

In this embodiment, examples of planar shapes and arrangement of pixels that can be used as pixels 130 included in the display device 100 are described with reference to FIGS. 18A and 18B.

Figure 18A:
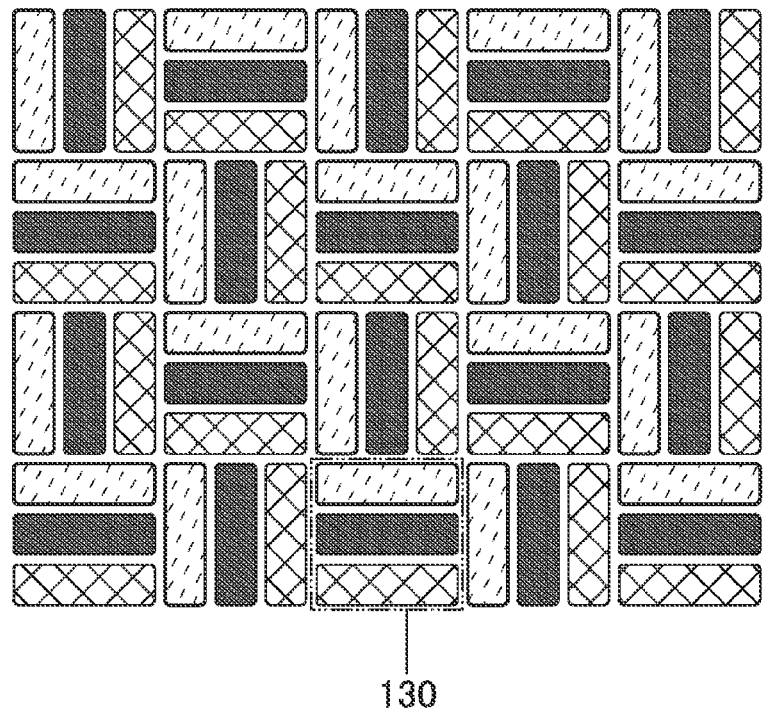
FIGS. 18A and 18B illustrate examples of planar shapes and arrangement of pixels.

FIG. 18A is an example in which the pixel 130 that has subpixels with H arrangement and the pixel 130 that has subpixels with V arrangement are alternately arranged in a lateral direction and in a longitudinal direction. When the pixel 130 with H arrangement and the pixel 130 with V arrangement are alternately arranged, variations in the display quality of the display device 100 can be reduced.

Figure 18B:
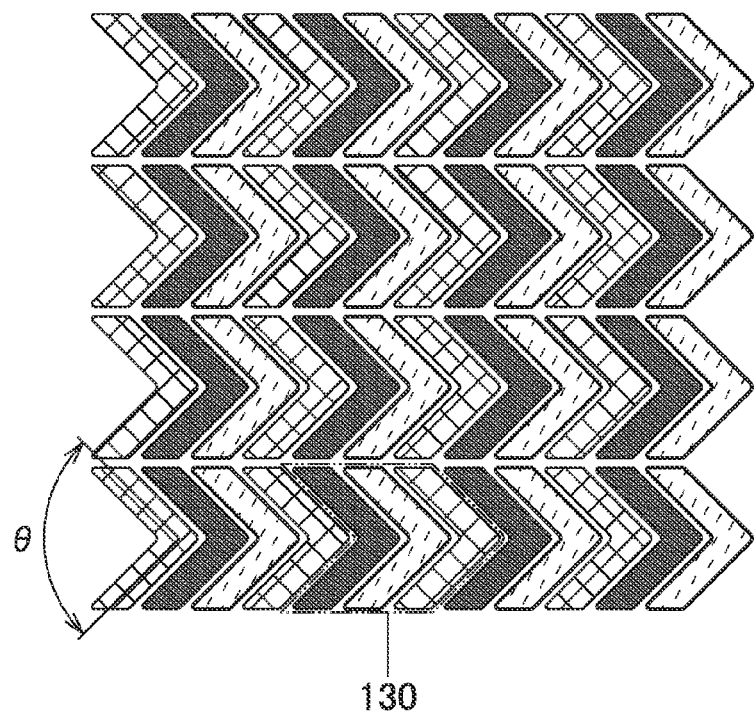
Figure 20A:
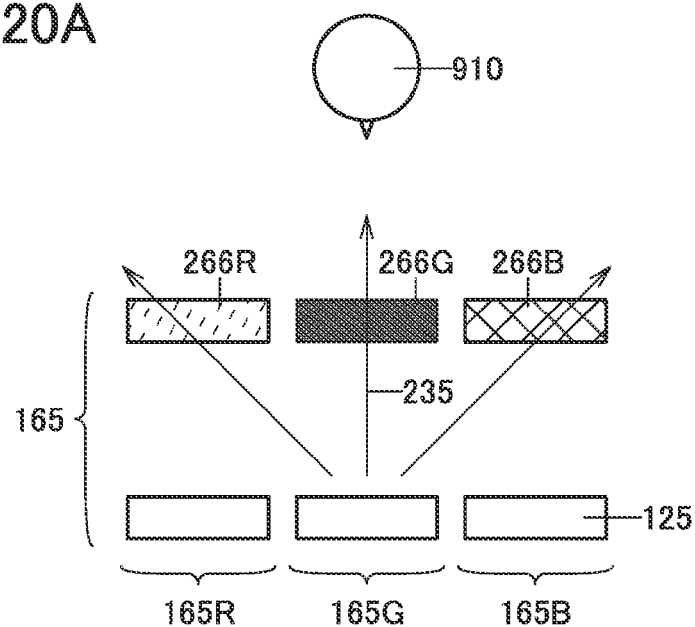
FIGS. 20A and 20B are diagrams illustrating problems.
Figure 20B:
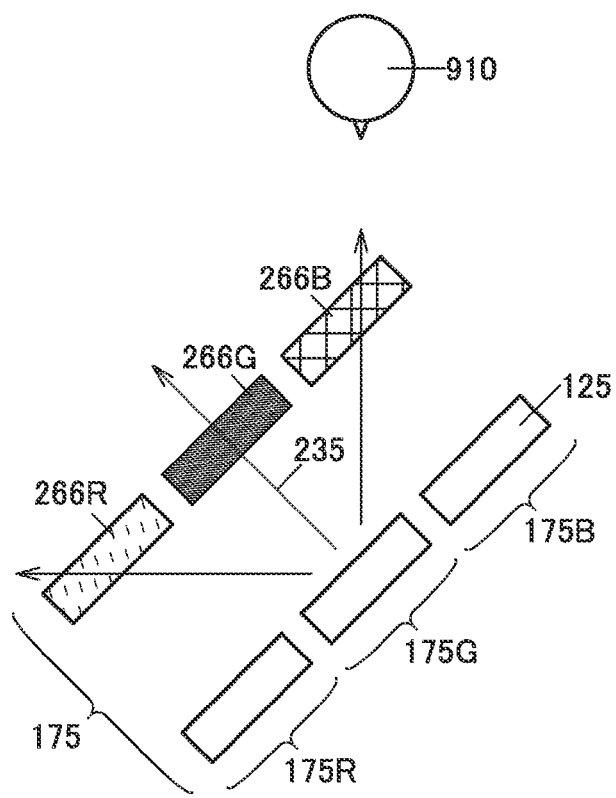

FIG. 18B is an example in which the planar shapes of the subpixels included in the pixel 130 are bent shapes. When the subpixels have bent shapes, an effect similar to the effect of the arrangement in FIG. 18A can be obtained, so that variations in display quality of the display device 100 can be reduced. Note that a refraction angle θ in FIG. 18B is preferably 80 to 100°, more preferably 85 to 95°.

The planar shapes and arrangement of the pixels in FIGS. 18A and 18B are particularly effective when the whole or most of the display region 131 is curved, for example.

This embodiment can be combined with any of the structures described in the other embodiments as appropriate.

Embodiment 9

In this embodiment, examples of an electronic device that includes the display device according to one embodiment of the present invention are described with reference to drawings.

Examples of an electronic device including a flexible display device include television sets (also referred to as televisions or television receivers), monitors of computers or the like, cameras such as digital cameras or digital video cameras, digital photo frames, mobile phones (also referred to as cellular phones or mobile phone devices), portable game machines, portable information terminals, audio reproducing devices, and large game machines such as pachinko machines.

Figure 23A:
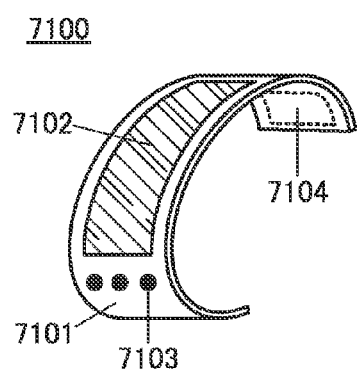
FIGS. 23A to 23C each illustrate an example of an electronic device.

FIG. 23A is an example of a wristband-type display device. A portable display device 7100 includes a housing 7101, a curved display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device according to one embodiment of the present invention. Thus, the portable display device can have high display quality and high reliability.

Figure 23B:
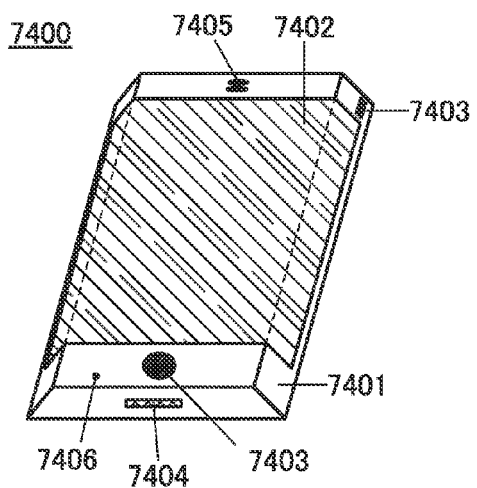

FIG. 23B is an example of a mobile phone. A mobile phone 7400 includes a display portion 7402 that has bent regions and is incorporated in a housing 7401. The mobile phone 7400 further includes operation buttons 7403, an external connection port 7404, a speaker 7405, a microphone 7406, and the like. The mobile phone 7400 is manufactured using the display device for the display portion 7402.

When the display portion 7402 is touched with a finger or the like, data can be input into the mobile phone 7400 in FIG. 23B. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device according to one embodiment of the present invention. Thus, the mobile phone can have high display quality and high reliability.

Figure 23C:
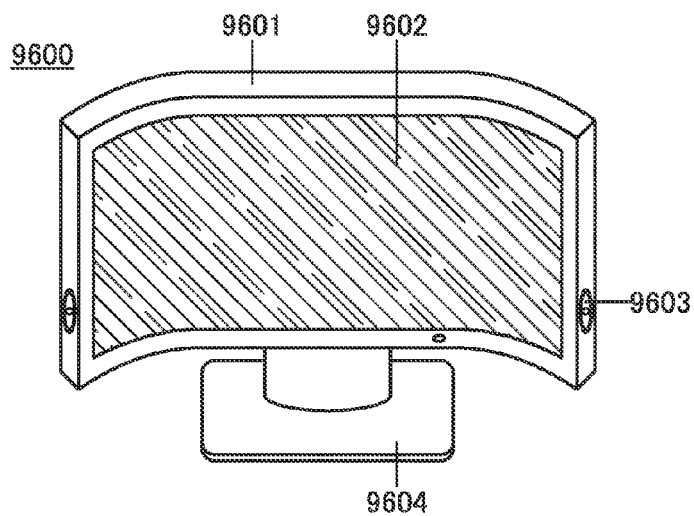

FIG. 23C is an example of a television set. In a television set 9600, a display portion 9602 is incorporated in a housing 9601. Images can be displayed on the display portion 9602 having curved regions. In addition, speakers 9603 are provided on the sides of the housing 9601. Here, the housing 9601 is supported by a stand 9604. By using the display device described in the above embodiment, a highly reliable television set can be obtained.

Here, the display portion 9602 includes the display device according to one embodiment of the present invention. Thus, the television set can have high display quality and high reliability.

The television set can be operated with an operation switch of the housing 9601 or a separate remote control. Furthermore, the remote control may include a display portion for displaying data output from the remote control.

Note that the television set includes a receiver, a modem, and the like. With the receiver, a general television broadcast can be received. Furthermore, when the television set is connected to a communication network with or without wires via the modem, one-way (from a sender to a receiver) or two-way (between a sender and a receiver or between receivers) information communication can be performed.

The structures, methods, and the like described in this embodiment can be combined with any of the structures, methods, and the like described in the other embodiments as appropriate.

This application is based on Japanese Patent Application serial No. 2013-192638 filed with Japan Patent Office on Sep. 18, 2013, the entire contents of which are hereby incorporated by reference.

What is claimed is:

1. A display device comprising a first display region and a second display region, the first display region and the second display region each comprising a pixel,
   wherein a surface of the first display region is inclined with respect to a surface of the second display region,
   wherein the pixel comprises a plurality of subpixels, and
   wherein an arrangement direction of the subpixels in the first display region is different from an arrangement direction of the subpixels in the second display region.

2. The display device according to claim 1, wherein the second display region comprises a driver circuit.

3. The display device according to claim 2, wherein the second display region is bent.

4. The display device according to claim 2, wherein the second display region is curved.

5. The display device according to claim 1,
   wherein the pixel comprises a light-emitting element, and
   wherein the light-emitting element emits white light.

6. The display device according to claim 1, wherein the pixel comprises a transistor comprising an oxide semiconductor.

7. The display device according to claim 6, wherein the oxide semiconductor comprises indium, gallium, and zinc.

8. A display device comprising a first display region and a second display region, the first display region and the second display region each comprising a pixel,
   wherein the pixel comprises a first subpixel and a second subpixel,
   wherein in the first display region, the first subpixel and the second subpixel are arranged in a first direction,
   wherein in the second display region, the first subpixel and the second subpixel are arranged in a second direction, and
   wherein the first direction is different from the second direction.

9. The display device according to claim 8, wherein the first direction is perpendicular to the second direction.

10. The display device according to claim 8, wherein the second display region comprises a driver circuit.

11. The display device according to claim 10, wherein the second display region is bent.

12. The display device according to claim 10, wherein the second display region is curved.

13. The display device according to claim 8,
wherein the first subpixel comprises a first coloring layer, and
wherein the second subpixel comprises a second coloring layer.

14. The display device according to claim 8,
wherein the pixel comprises a light-emitting element, and
wherein the light-emitting element emits white light.

15. The display device according to claim 8, wherein the pixel comprises a transistor comprising an oxide semiconductor.

16. The display device according to claim 15, wherein the oxide semiconductor comprises indium, gallium, and zinc.

* * * * *